(12) United States Patent
Takahashi

(10) Patent No.: US 7,510,937 B2
(45) Date of Patent: Mar. 31, 2009

(54) NONVOLATILE SEMICONDUCTOR MEMORY DEVICE AND FABRICATION METHOD FOR THE SAME

(75) Inventor: Keita Takahashi, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/020,744

(22) Filed: Jan. 28, 2008

(65) Prior Publication Data
US 2008/0303078 A1    Dec. 11, 2008

(30) Foreign Application Priority Data
Jun. 5, 2007 (JP) .............................. 2007-149074

(51) Int. Cl.
*H01L 21/336* (2006.01)
(52) U.S. Cl. .................. 438/270; 257/318; 257/316; 257/326; 257/E21.179; 257/E21.18; 257/E21.21; 257/E21.423; 257/E21.679
(58) Field of Classification Search ............ 438/201, 438/142, 197, 268, 269–274; 257/316, 315, 257/319, 314, 318, 326, E21.179, E21.18, 257/E21.423, E21.679
See application file for complete search history.

(56) References Cited
U.S. PATENT DOCUMENTS
5,994,733 A * 11/1999 Nishioka et al. ............ 257/316

6,316,314 B1    11/2001 Ishige
2002/0011624 A1    1/2002 Ishige
2005/0101065 A1    5/2005 Inoue
2007/0057309 A1 *    3/2007 Song et al. ............ 257/314

FOREIGN PATENT DOCUMENTS
JP    2005-109297    4/2005

* cited by examiner

Primary Examiner—Matthew Smith
Assistant Examiner—Wilner Jean Baptiste
(74) Attorney, Agent, or Firm—McDermott Will & Emery LLP

(57) ABSTRACT

The fabrication method for a nonvolatile semiconductor memory device having a memory cell area including memory cells and a peripheral circuit area adjacent to the memory cell area and including peripheral transistors, the method including the steps of: (1) forming a first active region in the memory cell area and a second active region in the peripheral circuit area in a substrate by forming isolation insulating films in the memory cell area and the peripheral circuit area so as to be away from a boundary therebetween; (2) forming a bottom insulating film and an intermediate charge trap film sequentially over the entire surface of the substrate; (3) removing a portion of the intermediate charge trap film formed in the peripheral circuit area using a first mask film; (4) forming a gate insulating film in the peripheral circuit area and also at least part of a top insulating film in the memory cell area; (5) forming a gate electrode film on the top insulating film and the gate insulating film; and (6) forming gate electrodes of memory cells and peripheral transistors by patterning the gate electrode film. The step (3) includes a step of aligning an end of the first mask film with the boundary in the substrate.

13 Claims, 18 Drawing Sheets

US 7,510,937 B2

NONVOLATILE SEMICONDUCTOR MEMORY DEVICE AND FABRICATION METHOD FOR THE SAME

CROSS-REFERENCE TO RELATED APPLICATIONS

This application claims priority under 35 U.S.C. §119 on Patent Application No. 2007-149074 filed in Japan on Jun. 5, 2007, the entire contents of which are hereby incorporated by reference.

BACKGROUND OF THE INVENTION

The present invention relates to a nonvolatile semiconductor memory device, especially a metal oxide nitride oxide semiconductor (MONOS) memory, and a fabrication method for such a memory device.

In recent years, with higher integration and lower cost of nonvolatile semiconductor memory devices, MONOS memory technology has been proposed in which a virtual ground array is adopted to allow local charge trapping.

MONOS memory cells have a 3-layer oxide nitride oxide (ONO) insulating film made of a bottom silicon oxide film, an intermediate silicon nitride film and a top silicon oxide film as a gate insulating film, and thus are different in structure from metal oxide semiconductor (MOS) transistors used for peripheral circuits, which have a silicon oxide film as a gate insulating film. For this reason, importance must be put in the technology on formation of the boundary between a memory cell area having the MONOS structure and a peripheral circuit area.

Hereinafter, an area where an ONO insulating film exists in formation of a gate electrode is defined as the memory cell area, while an area where the ONO insulating film has been removed in formation of a gate electrode is defined as the peripheral circuit area. In other words, the memory cell area and the peripheral circuit area are defined as distinguished from each other depending on whether or not an ONO insulating film exists. In some cases, therefore, gate electrodes formed continuously to constitute word lines for memory cells may extend from the memory cell area into the peripheral circuit area.

The ONO insulating film boundary does not necessarily agree with the boundary of wells.

A conventional nonvolatile semiconductor memory device and a fabrication method for the same will be described with reference to relevant drawings. See Japanese Laid-Open Patent Publication No. 2005-109297, for example.

FIG. 15 shows a plan configuration of a memory chip as a conventional nonvolatile semiconductor memory device. In FIG. 15, a gate insulating film is omitted for simplification.

As shown in FIG. 15, the memory chip includes a memory cell area 31 having a MONOS structure and a peripheral circuit area 32, and a memory cell boundary 33 defines the boundary between the memory cell area 31 and the peripheral circuit area 32. In the memory cell area 31, formed are MONOS memory cells each made of an active region 34 in a cell well and a gate electrode 35. In the peripheral circuit area 32, formed are MOS transistors each made of an active region 36 in a transistor well and a gate electrode 37. Although not shown in FIG. 15, an ONO insulating film is formed between the active region 34 and the gate electrodes 35 in the memory cell area 31, while a gate insulating film is formed between the active region 36 and the gate electrodes 37 in the peripheral circuit area 32. The gate electrodes 35 formed in the memory cell area 31 constitute word lines, which extend into the peripheral circuit area 32. Shallow trench isolation (STI) 38 surrounds the active region 34 in the cell well and the active regions 36 in the transistor well.

FIGS. 16A to 16C, 17A to 17C, 18A to 18C and 19A to 19C show cross-sectional configurations in the fabrication process steps for the memory chip as the conventional nonvolatile semiconductor device. Note that while the cross-sectional configurations of FIGS. 16A to 18C are common for both the section taken along line XVa-XVa and the section taken along line XVb-XVb in FIG. 15, FIG. 19A shows only the XVa-XVa section and FIGS. 19B and 19C show only the XVb-XVb section. Note also that the line XVb-XVb in FIG. 15 represents a section where no gate electrode 35 is formed.

First, as shown in FIG. 16A, a cell well 39 and a transistor well 40 are formed on a semiconductor substrate 30 in the memory cell area 31 and the peripheral circuit area 32, respectively. The STI 38 as an isolation film is then formed, and the active regions 34 and 36 are respectively formed in the cell well 39 and the transistor well 40. The transistor well 40 is actually composed of an n-type well, a p-type well, a deep n-type well and the like. The cell well 39 may be composed of a p-type well and, occasionally, a deep n-type well.

As shown in FIG. 16B, an ONO insulating film made of a bottom oxide film 41 having a thickness of about 5 nm, an intermediate nitride film 42 having a thickness of about 10 nm, and a top oxide film 43 having a thickness of about 15 nm is formed. The portion of the ONO insulating film formed in the memory cell area 31 constitutes a gate insulating film of MONOS memory cells.

As shown in FIG. 16C, using an ONO processing mask 44 formed above the cell well 39, the portion of the top oxide film 43 located above the transistor well 40 is removed by wet etching.

As shown in FIG. 17A, the ONO processing mask 44 is removed, and using the top oxide film 43 above the cell well 39 as a mask, the portion of the intermediate nitride film 42 located above the transistor well 40 is removed by wet etching.

The top oxide film 43 may be formed in a step of forming a gate oxide film of peripheral transistors, not forming in the step of forming the ONO insulating film shown in FIG. 16B. Otherwise, the top oxide film 43 may be formed in both the step of forming the ONO insulating film and the step of forming a gate oxide film of peripheral transistors. The portions of the top oxide film 43 and intermediate nitride film 42 formed above the transistor well 40 may be removed in succession by dry etching using the ONO processing mask 44 formed above the cell well 39.

As shown in FIG. 17B, the entire wafer is wet-etched with no mask used, to remove the portion of the bottom oxide film 41 formed above the transistor well 40. In this step, part or the entire of the top oxide film 43 above the cell well 39 is also removed simultaneously. The final top oxide film 43 will however be formed in the later step of forming a gate insulating film of peripheral transistors.

During the wet etching of the portion of the bottom oxide film 41 formed above the transistor well 40, the portion of the STI 38 at the boundary between the cell well 39 and the transistor well 40 is also partially removed, forming a step between the STI 38 and the transistor well 40. Moreover, if the wet etching is made using hydrofluoric acid and the like, the etching rate of the intermediate nitride film 42 is lower than that of the silicon oxide film constituting the bottom oxide film 41 and the top oxide film 43. Therefore, the top oxide film 43 overlying the intermediate nitride film 42 and the bottom oxide film 41 and the STI 38 underlying the intermediate nitride film 42 may be etched away at their end portions, leaving the intermediate nitride film 42 overhanging. FIG. 17C shows a cross-sectional configuration illustrating the thus-etched boundary between the cell well 39 and the transistor well 40.

As shown in FIG. 18A, a gate oxide film 45, which is to be a gate insulating film of MOS transistors used in peripheral circuits is formed on the transistor well 40 by thermal oxidation. Although the gate oxide film is actually made of a plurality of layers in many cases, it is simply shown as a single-layer film in FIG. 18A. During the formation of the gate oxide film 45, the thickness of the top oxide film 43 above the cell well 39 increases a little although illustration on this increase is omitted.

In the step of forming the gate oxide film 45, the gate oxide film 45 is formed while the intermediate nitride film 42 is kept overhanging. Although the thicknesses of the top oxide film 43, the bottom oxide film 41, the intermediate nitride film 42 and the STI 38 respectively increase a little during the formation of the gate oxide film 45 by thermal oxidation, the rate of oxidation of these films is significantly low compared with that of the active region 36 in the transistor well 40 made of silicon, and thus the intermediate nitride film 42 is kept overhanging. Note that illustration is omitted on the increase in the thicknesses of the top oxide film 43, the bottom oxide film 41, the intermediate nitride film 42 and the STI 38.

As shown in FIG. 18B, polysilicon 46, which is to be gate electrodes of MONOS memory cells and MOS transistors, is deposited on the top surface of the resultant semiconductor substrate 30.

In the step of forming the polysilicon 46, as shown in FIG. 18C, which shows the case of FIG. 17C where the intermediate nitride film 42 overhangs, the polysilicon 46 is formed even under the overhang to bury the boundary between the ONO insulating film and the gate oxide film 45.

As shown in FIG. 19A, the polysilicon 46 is etched to form the gate electrode 35 of MONOS memory cells and the gate electrode 37 of MOS transistors.

According to the conventional technique, however, the portion of the STI 38 removed during the removal of the portion of the bottom oxide film 41 above the transistor well 40 forms a depression at the boundary between the ONO insulating film and the gate oxide film 45. Having such a depression, a post-etch residue may be produced in the depression at the etching of the polysilicon 46.

Since polysilicon is good in deposition in a depression, it can be efficiently formed in the depression existing at the boundary between the ONO insulating film and the gate oxide film 45, as shown in FIGS. 18B and 18C. In particular, as shown in FIG. 18C, which shows the case that the intermediate nitride film 42 overhangs, polysilicon is deposited even under the overhang of the intermediate nitride film 42. The thus-formed polysilicon 46 is likely to produce a post-etch residue at the etching. Because the overhang serves as a mask, the underlying portion is inevitably left unetched. Production of such a post-etch residue depends on the etching conditions of the polysilicon 46 and the shape and length of the overhang of the intermediate nitride film 42.

FIG. 19B shows a cross-sectional configuration of a region in which the memory cell area 31 has no gate electrode 35.

As shown in FIG. 19B, a depression is generally formed at the boundary between the ONO insulating film and the gate oxide film 45 and a post-etch residue of the polysilicon 46 is left behind like a sidewall on the bottom of the depression even when the intermediate nitride film 42 does not overhang, forming a polysilicon residue 101.

The polysilicon residue 101 shown in FIG. 19B may be in contact with an extension of the gate electrode 35, which constitutes a word line in the memory cell area 31, into the peripheral circuit area 32, and this may possibly cause a short between gate electrodes in the memory cell area 31. Also, such a residue may come off and becomes particles.

FIG. 19C shows a cross-sectional configuration of a region in which the memory cell area 31 has no gate electrode 35 and the intermediate nitride film 42 overhangs.

As shown in FIG. 19C, the portion of the polysilicon 46 formed under the overhang of the intermediate nitride film 42 is left unetched at the etching of the polysilicon 46, forming a polysilicon residue 101 as a post-etch residue.

The polysilicon residue 101 shown in FIG. 19C may be in contact with an extension of the gate electrode 35, which constitutes a word line in the memory cell area 31, into the peripheral circuit area 32, and this may possibly cause a short between gate electrodes in the memory cell area 31. Also, such a residue may come off and becomes particles.

As described above, the polysilicon residue 101 as a post-etch residue of the polysilicon 46 may be formed, and this may cause a short between gate electrodes or be lifted off to become a source of particles. In either case, the yield will be degraded.

SUMMARY OF THE INVENTION

An object of the present invention is providing a nonvolatile semiconductor memory device and a fabrication method for the same, in which no post-etch residue of polysilicon is produced at a memory cell boundary.

To attain the object described above, a semiconductor device of the present invention is configured so that at a memory cell boundary between a memory cell area and a peripheral circuit area, no depression is formed between an ONO insulating film in the memory cell area and a gate insulating film in the peripheral circuit area and also an intermediate nitride film of the ONO insulating film has no overhang.

Specifically, the first fabrication method of the present invention is a fabrication method for a nonvolatile semiconductor memory device including a memory cell area including memory cells and a peripheral circuit area adjacent to the memory cell area and including peripheral transistors, the method including the steps of: (1) forming a first active region in the memory cell area and a second active region in the peripheral circuit area in a substrate by forming isolation insulating films in the memory cell area and the peripheral circuit area so as to be away from a boundary between the memory cell area and the peripheral circuit area; (2) forming a bottom insulating film and an intermediate charge trap film sequentially over the entire surface of the substrate; (3) removing a portion of the intermediate charge trap film formed in the peripheral circuit area using a first mask film; (4) forming a gate insulating film in the peripheral circuit area and also at least part of a top insulating film in the memory cell area; (5) forming a gate electrode film on the top insulating film and the gate insulating film; and (6) forming gate electrodes of memory cells and gate electrodes of peripheral transistors by patterning the gate electrode film, wherein the step (3) includes a step of aligning an end of the first mask film with the boundary in the substrate.

According to the first fabrication method for a nonvolatile semiconductor memory device of the present invention, it is possible to fabricate a nonvolatile semiconductor memory device in which the boundary between the memory cell area and the peripheral circuit area is located above an active region in the semiconductor substrate. At the boundary, therefore, the bottom insulating film, the intermediate charge trap film and the top insulating film in the memory cell area are connected with the gate insulating film in the peripheral circuit area, and thus no depression will be formed at the boundary. It is therefore possible to prevent occurrence of a short between gate electrodes and formation of particles both caused by a post-etch residue. With no yield degradation, therefore, the yield of the MONOS memory can be secured stably.

In the first fabrication method described above, in the step (4), the gate insulating film is preferably made to be connected with the bottom insulating film, the intermediate charge trap film and the top insulating film at the boundary.

In the first fabrication method described above, in the step (6), the gate electrode film may be left unremoved over a boundary between the memory cell area and an area other than the peripheral circuit area.

By adopting the above method, a boundary between the memory cell area and an area other than the peripheral circuit area is covered with the gate electrode film. This can prevent production of a polysilicon post-etch residue at this boundary.

Preferably, the first fabrication method described above further includes, between the steps (3) and (4), the step (7) of removing a portion of the bottom insulating film in the peripheral circuit area.

The second fabrication method of the present invention is a fabrication method for a nonvolatile semiconductor memory device including a memory cell area including memory cells and a peripheral circuit area adjacent to the memory cell area and including peripheral transistors, the method including the steps of: (1) forming a first active region in the memory cell area and a second active region in the peripheral circuit area in a substrate by forming isolation insulating films in the memory cell area and the peripheral circuit area; (2) forming a bottom insulating film and an intermediate charge trap film sequentially over the entire surface of the substrate; (3) removing a portion of the intermediate charge trap film formed in the peripheral circuit area using a first mask film; (4) removing a portion of the bottom insulating film formed in the peripheral circuit area using a second mask film; (5) forming a gate insulating film in the peripheral circuit area and also at least part of a top insulating film in the memory cell area; (6) forming a gate electrode film on the top insulating film and the gate insulating film; and (7) forming gate electrodes of memory cells and gate electrodes of peripheral transistors by patterning the gate electrode film, wherein in the step (4), the second mask film is formed to be wider toward the peripheral circuit area than the first mask film at the boundary between the memory cell area and the peripheral circuit area, to cover an end of the intermediate charge trap film.

According to the second fabrication method for a nonvolatile semiconductor memory device of the present invention, no depression will be formed at the boundary between the memory cell area and the peripheral circuit area, and the end of the intermediate charge trap film will not overhang into the peripheral circuit area. It is therefore possible to prevent production of a post-etch residue at the boundary, and thus prevent occurrence of a short between gate electrodes and formation of particles both caused by a post-etch residue.

In the first or second fabrication method described above, the step (2) preferably includes a step of forming a lower layer of the top insulating film on the intermediate charge trap film.

In the first or second fabrication method described above, the step (3) preferably includes a step of removing a portion of the lower layer of the top insulating film formed in the peripheral circuit area using the first mask film, then removing the first mask film, and removing a portion of the intermediate charge trap film formed in the peripheral circuit area using the lower layer of the top insulating film in the memory cell area as a mask film.

In the first or second fabrication method described above, in the step (3), a portion of the lower layer of the top insulating film and a portion of the intermediate charge trap film formed in the peripheral circuit area are preferably removed in succession by dry etching using the first mask film.

By adopting the above method, the top insulating film and the intermediate charge trap film can be removed in succession.

The third fabrication method of the present invention is a fabrication method for a nonvolatile semiconductor memory device including a memory cell area including memory cells and a peripheral circuit area adjacent to the memory cell area and including peripheral transistors, the method including the steps of: (1) forming a bottom insulating film, an intermediate charge trap film and a sacrifice insulating film sequentially over the entire surface of the substrate; (2) removing a portion of the sacrifice insulating film and a portion of the intermediate charge trap film formed in the peripheral circuit area using a first mask film; (3) removing a portion of the sacrifice insulating film formed in the memory cell area using a second mask film; (4) forming a gate insulating film in the peripheral circuit area and also a top insulating film in the memory cell area; (5) forming a gate electrode film on the top insulating film and the gate insulating film; and (6) forming gate electrodes of memory cells and gate electrodes of peripheral transistors by patterning the gate electrode film, wherein in the step (3), the second mask film is formed to cover an end of the intermediate charge trap film at a boundary between the memory cell area and the peripheral circuit area.

Preferably, the third fabrication method described above further includes, between the steps (2) and (3), the step of (4) removing a portion of the bottom insulating film formed in the peripheral circuit area using a third mask film formed to be wider toward the peripheral circuit area than the first mask film at the boundary to cover the end of the intermediate charge trap film.

The nonvolatile semiconductor memory device of the present invention includes: memory cells each having a charge trap film made of a bottom insulating film, an intermediate charge trap film and a top insulating film and a first gate electrode formed on the charge trap film, the memory cells being formed in a memory cell area defined with a first isolation insulating film in a substrate; and peripheral transistors each having a gate insulating film and a second gate electrode formed on the gate insulating film, the peripheral transistors being formed in a peripheral circuit area adjacent to the memory cell area and defined with a second isolation insulating film, wherein the first isolation insulating film and the second isolation insulating film are formed apart from each other at a boundary between the memory cell area and the peripheral circuit area, and the boundary over which the first gate electrode extends is located in an area between the first isolation insulating film and the second isolation insulating film, and the first charge trap film and the gate insulating film are connected with each other.

According to the nonvolatile semiconductor memory device of the present invention, the boundary between the memory cell area and the peripheral circuit area is located above an active region in the semiconductor substrate. No depression is therefore formed, and thus it is possible to prevent occurrence of a short between gate electrodes and formation of particles both caused by a post-etch residue.

In the nonvolatile semiconductor memory device described above, preferably, the first gate electrode and the second gate electrode are formed from a gate electrode film, and the gate electrode film is formed to cover another boundary between the memory cell area and an area other than the peripheral circuit area.

In the nonvolatile semiconductor memory device described above, preferably, an end of the intermediate charge trap film at the another boundary overhangs into the area other than the peripheral circuit area with a portion of the isolation insulating film under the end of the intermediate charge trap film being shaved, and the gate electrode film is formed to bury a portion under the overhang of the intermediate charge trap film.

With the above configuration, a boundary between the memory cell area and an area other than the peripheral circuit area is covered with the gate electrode film. This can prevent production of a polysilicon post-etch residue at the boundary.

DESCRIPTION OF THE PREFERRED EMBODIMENTS

Figure 1:
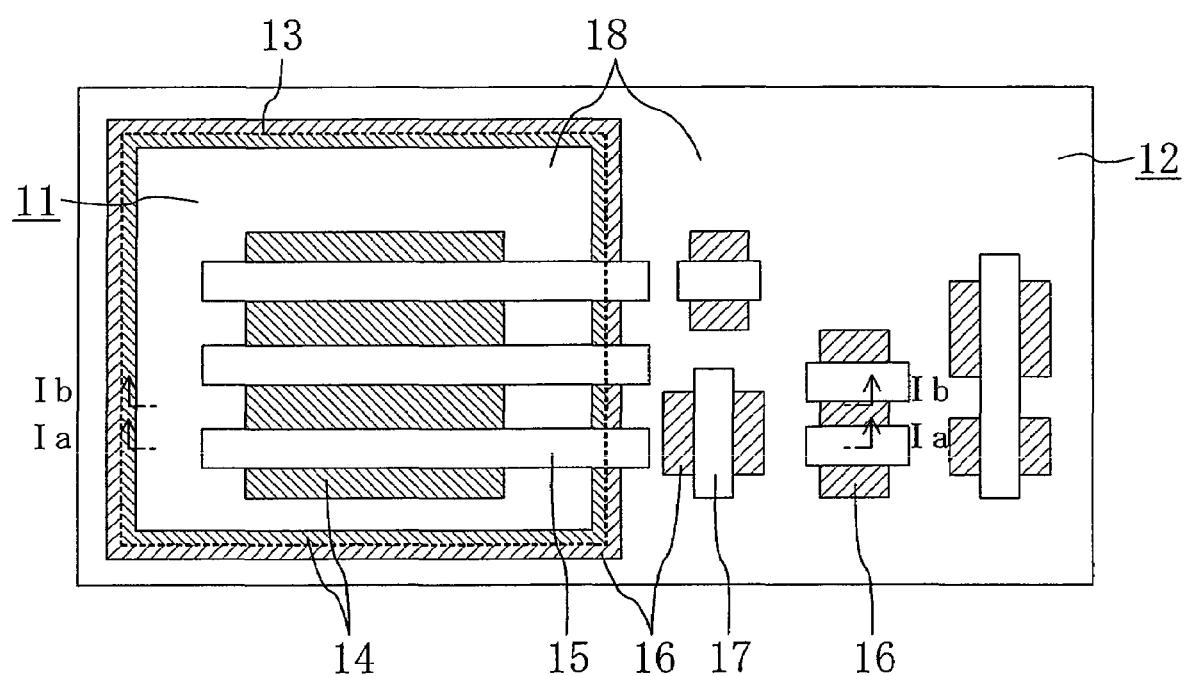
FIG. 1 is a plan view of Embodiment 1 of the present invention.

Hereinafter, preferred embodiments of the present invention will be described with reference to the accompanying drawings. Note that the same components are denoted by the same reference numerals, and description thereof is not repeated.

Embodiment 1

A nonvolatile semiconductor memory device and a fabrication method for the same of Embodiment 1 of the present invention will be described with reference to the relevant drawings.

FIG. 1 shows a plan configuration of the nonvolatile semiconductor memory device of Embodiment 1. Note that a gate insulating film that should lie under gate electrodes is omitted in FIG. 1.

As shown in FIG. 1, the nonvolatile semiconductor memory device includes a memory cell area 11 having a MONOS structure and a peripheral circuit area 12. A memory cell boundary 13 defines the boundary between the memory cell area 11 and the peripheral circuit area 12. In the memory cell area 11, formed are MONOS memory cells each made of an active region 14 and a gate electrode 15. In the peripheral circuit area 12, formed are MOS transistors each made of an active region 16 and a gate electrode 17. The memory cell boundary 13 is formed between the active regions 14 and 16. Although not shown in FIG. 1, an ONO insulating film as an electron trap film is formed between the active region 14 and the gate electrodes 15 in the memory cell area 11, while a gate insulating film is formed between the active region 16 and the gate electrodes 17 in the peripheral circuit area 12. That is, the boundary between the ONO insulating film and the gate insulating film defines the memory cell boundary 13. The gate electrodes 15 of MONOS memory cells constitute word lines, which extend into the peripheral circuit area 12. A feature of Embodiment 1 is that the memory cell boundary 13 is not formed above shallow trench isolation (STI) 18. Note that the gate electrodes 15 of MONOS memory cells, which constitute word lines, are not necessarily formed to extend into the peripheral circuit area 12.

A process flow of the nonvolatile semiconductor memory device of Embodiment 1 of the present invention will be described with reference to FIGS. 2A to 2C, 3A to 3C, 4A, 4B, 5A and 5B, which show cross-sectional configurations in the fabrication process steps for the nonvolatile semiconductor memory device of Embodiment 1. Note that while the cross-sectional configurations of FIGS. 2A to 5A are common for both the section taken along line Ia-Ia and the section taken along line Ib-Ib in FIG. 1, FIG. 5B shows only the section taken along line Ia-Ia, that is, a section including a gate electrode 15 of MONOS memory cells. Note also that FIGS. 3C and 4B show enlarged cross-sectional configurations of the boundary between the memory cell area 11 and the peripheral circuit area 12.

Figure 2A:
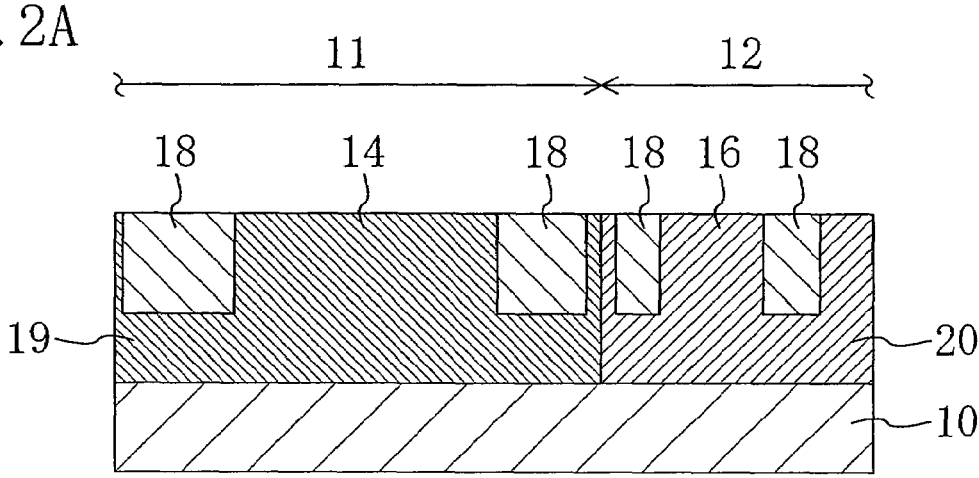
FIGS. 2A to 2C are cross-sectional views showing a process flow of Embodiment 1 of the present invention.

First, as shown in FIG. 2A, a cell well 19, a transistor well 20 and the STI 18 that is to be an isolation film are formed on a semiconductor substrate 10. The active regions 14 and 16 are respectively formed in the cell well 19 and the transistor well 20. It is noted that the STI 18 is not formed at the boundary between the cell well 19 and the transistor well 20.

Figure 2B:
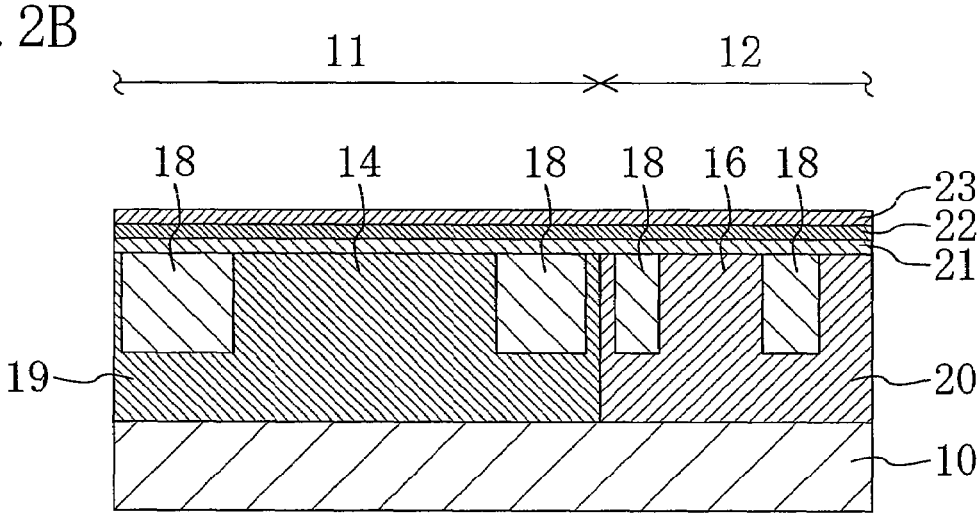

As shown in FIG. 2B, an ONO insulating film composed of a bottom oxide film 21 as a bottom insulating film, an intermediate nitride film 22 as an intermediate charge trap film, and a top oxide film 23 as a top insulating film is formed. The portion of the ONO insulating film formed in the memory cell area 11 constitutes a gate insulating film of MONOS memory cells.

Figure 2C:
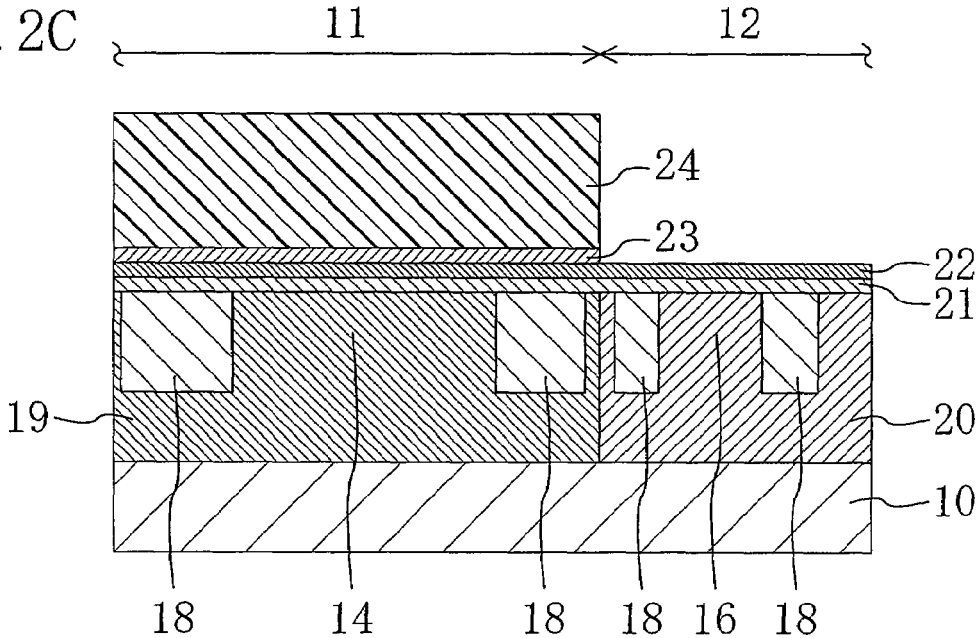

As shown in FIG. 2C, an ONO processing mask 24 is formed on the memory cell area 11, and the portion of the top oxide film 23 formed in the peripheral circuit area 12 is removed by wet etching.

Figure 3A:
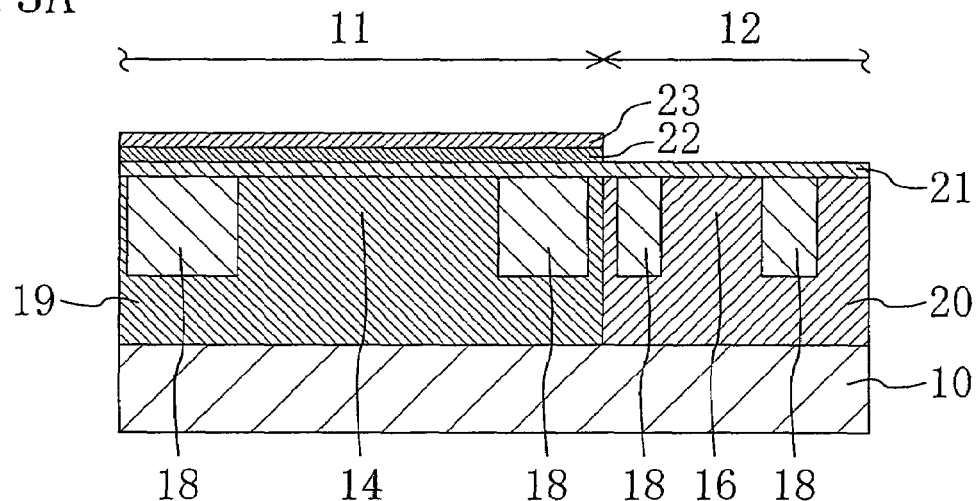
FIGS. 3A to 3C are cross-sectional views showing the process flow of Embodiment 1 of the present invention.

As shown in FIG. 3A, the ONO processing mask 24 is removed, and using the top oxide film 23 in memory cell area 11 as a mask, the portion of the intermediate nitride film 22 formed in the peripheral circuit area 12 is removed by wet etching.

The top oxide film 23 may not be formed in the step of forming the ONO insulating film shown in FIG. 2B, but be formed in a later step of forming a gate oxide film of peripheral transistors. Otherwise, the top oxide film 23 may be formed in both the step of forming the ONO insulating film and the step of forming a gate oxide film of peripheral transistors. The portions of the top oxide film 23 and intermediate nitride film 22 formed in the peripheral circuit area 12 may be removed in succession by dry etching using the ONO processing mask.

Figure 3B:
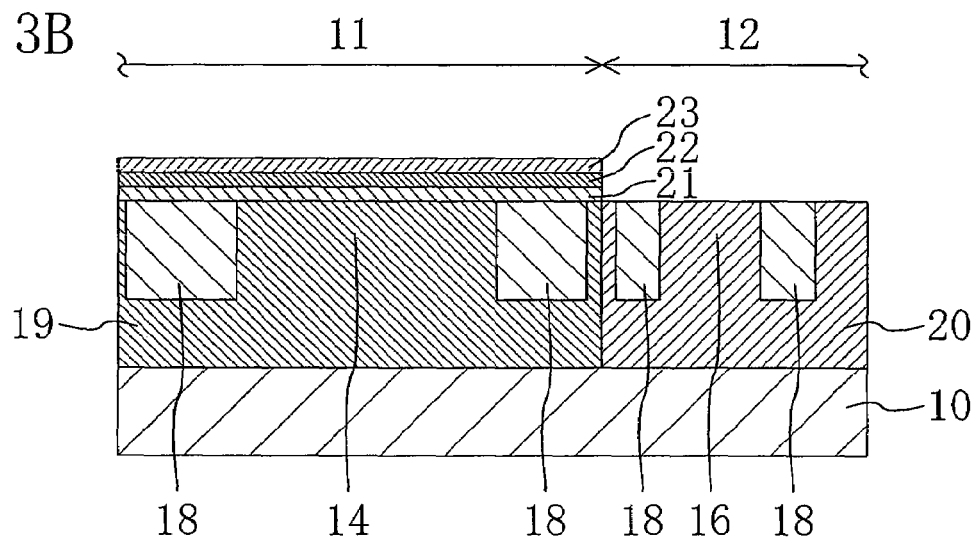
Figure 3C:
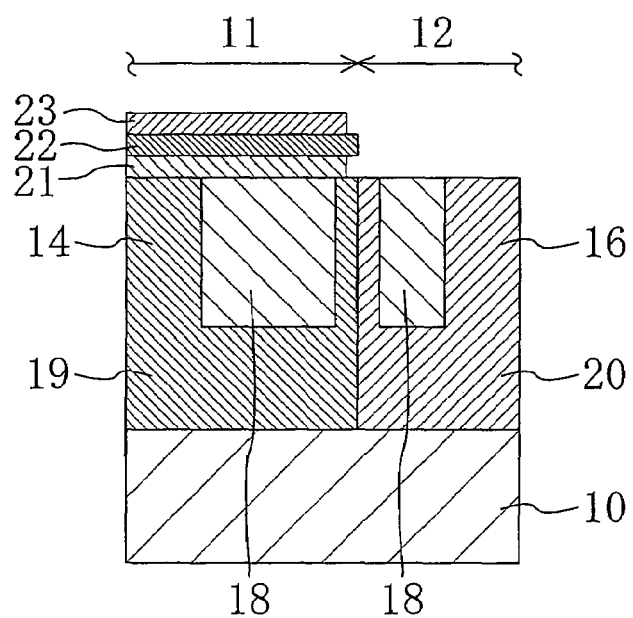

As shown in FIG. 3B, using the intermediate nitride film 22 in the memory cell area 11 as a mask, the portion of the bottom oxide film 21 formed in the peripheral circuit area 12 is removed by wet etching. During this wet etching, part of the STI 18 is also removed simultaneously. However, since the STI 18 does not exist under the end portion of the ONO insulating film, it is only a step corresponding to the thickness of the ONO insulating film (up to about 20 nm) that is formed at the end of the ONO insulating film.

Part or the entire of the top oxide film 23 in the memory cell area 11 is also removed during the removal of the portion of the ONO insulating film formed in the peripheral circuit area 12. The final top oxide film 23 will however be formed in a later step of forming a gate insulating film in the peripheral circuit area 12.

As shown in FIG. 3C, the end portion of the ONO insulating film at the boundary between the memory cell area 11 and the peripheral circuit area 12 may have an overhang of the intermediate nitride film 22 toward the peripheral circuit area 12. This is because the etching rate of the intermediate nitride film 22 is lower than that of the silicon oxide film constituting the bottom oxide film 21 and the top oxide film 23 during the wet etching. In particular, in wet etching using hydrofluoric acid, the intermediate nitride film 22 as a silicon nitride film is hardly etched.

Figure 4A:
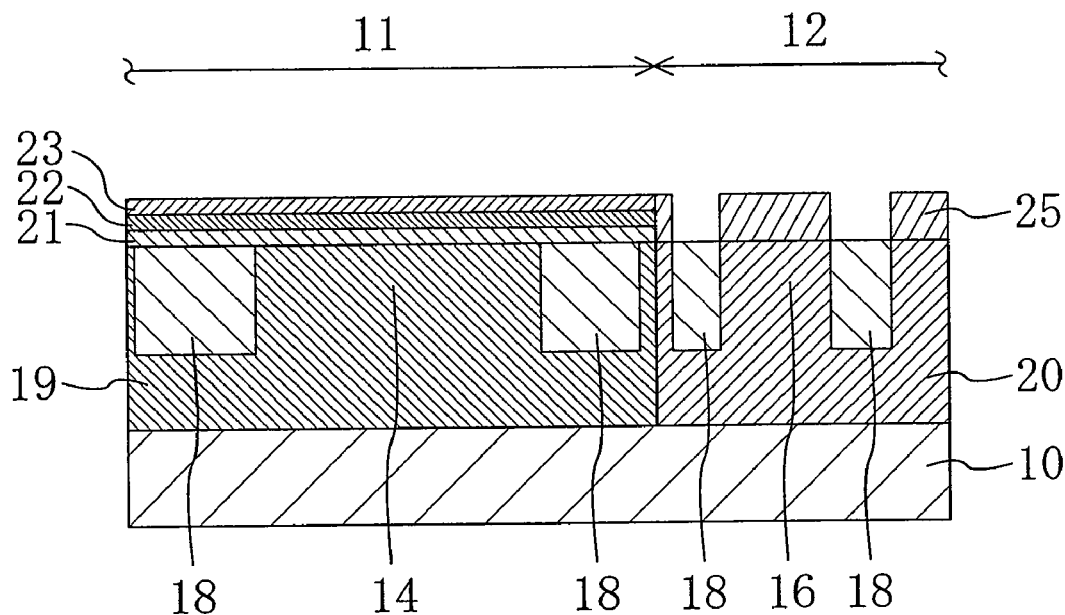
FIGS. 4A and 4B are cross-sectional views showing the process flow of Embodiment 1 of the present invention.
Figure 4B:
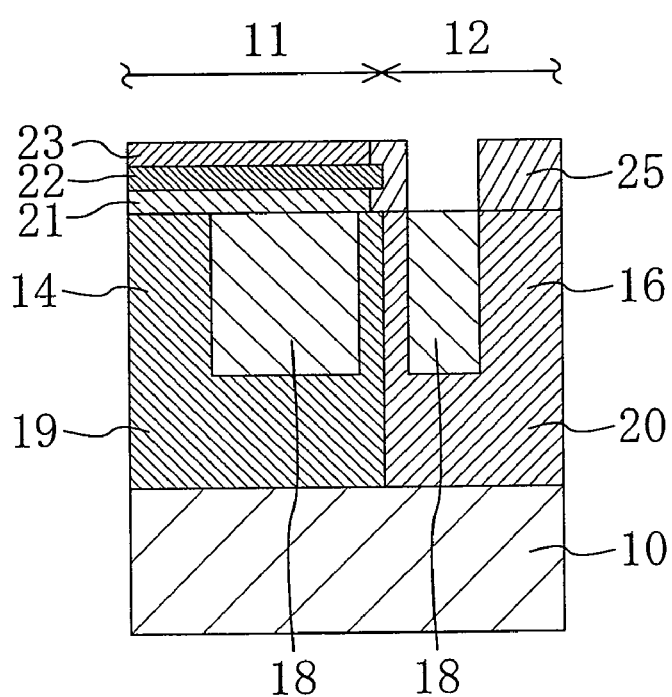

As shown in FIG. 4A, a gate oxide film 25, which is to be a gate insulating film of MOS transistors in the peripheral circuit area 12, is formed by thermal oxidation. In this step, the top oxide film 23 in the memory cell area 11, part or the entire of which has been removed during the removal of the portion of the ONO insulating film formed in the peripheral circuit area 12, is also formed simultaneously.

When the intermediate nitride film 22 of the ONO insulating film has an overhang, as shown in FIG. 4B, no void will be formed under the overhang of the intermediate nitride film 22 because the portion of the semiconductor substrate 10 located under the overhang of the intermediate nitride film 22 is also oxidized forming the gate oxide film 25 to be connected with the end of the bottom oxide film 21. In this way, having the gate oxide film 25 formed to be connected with the end of the ONO insulating film, no void will be formed at the end of the ONO insulating film, providing a roughly flat top surface of the semiconductor substrate 10.

Figure 5A:
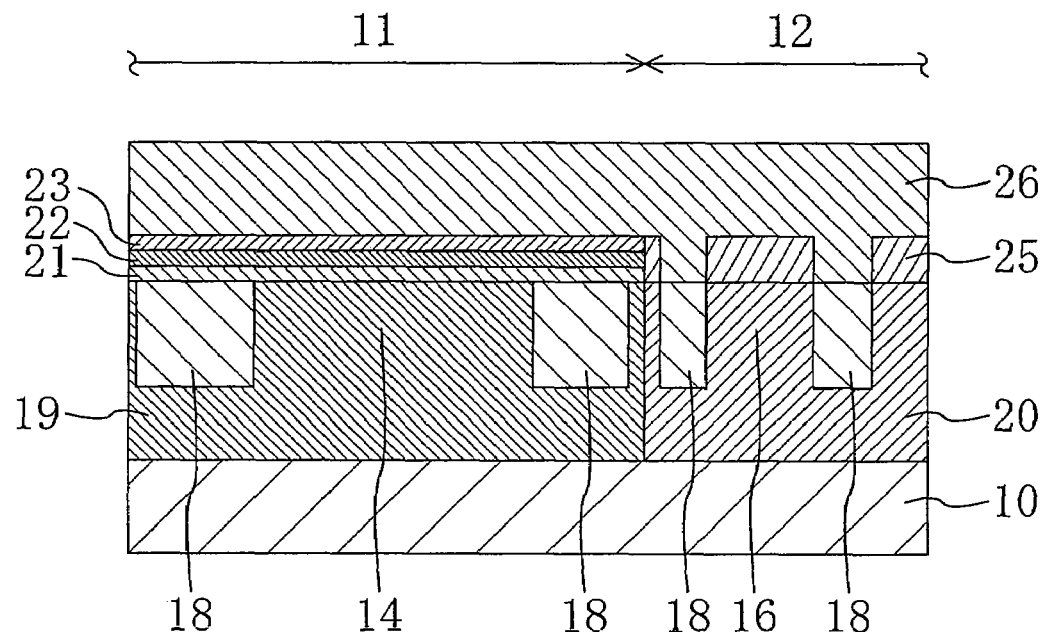
FIGS. 5A and 5B are cross-sectional views showing the process flow of Embodiment 1 of the present invention.
Figure 5B:
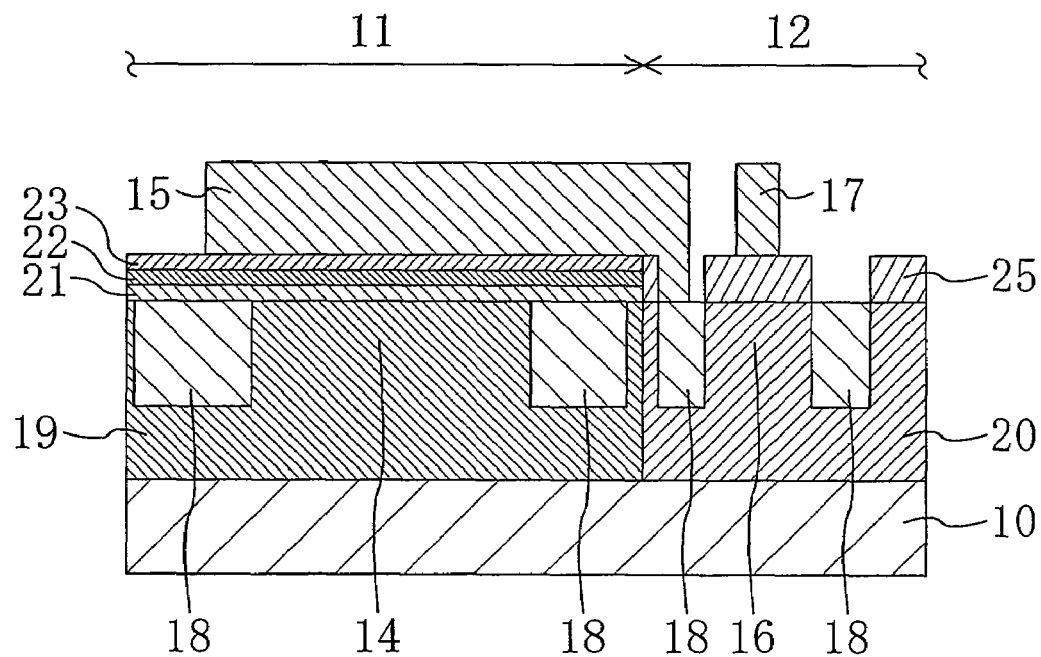

As shown in FIG. 5A, polysilicon 26, which is to be gate electrodes of MONOS memory cells and MOS transistors is deposited on the top surface of the semiconductor substrate 10. Since no depression or void is formed at the boundary between the ONO insulating film and the gate oxide film 25, the polysilicon 26 formed over the boundary is also flat. Although FIG. 5A shows the case of having no overhang of the intermediate nitride film 22 at the end of the ONO insulating film, the top surface of polysilicon at the boundary will also be flat like the polysilicon 26 shown in FIG. 5A even when the intermediate nitride film 22 has an overhang.

As shown in FIG. 5B, the polysilicon 26 is etched to form the gate electrode 15 of MONOS memory cells and the gate electrode 17 of MOS transistors. It is needless to mention that the cross-sectional configuration of the portion having no gate electrode 15 after the formation of the gate electrodes 15 of MONOS memory cells, that is, the cross-sectional configuration taken along line 1b-1b in FIG. 1 is the same as that of FIG. 4B.

Note that although the boundary between the active region 14 in the cell well 19 and the active region 16 in the transistor well 20 is illustrated as being in line with the end of the intermediate nitride film 22 in the figures, it is not necessarily in line therewith.

As described above, in the fabrication method for the nonvolatile semiconductor device of Embodiment 1, in which the memory cell boundary is formed above the active region, not above the STI region, no depression will be formed between the ONO insulating film of MONOS memory cells and the gate oxide film of MOS transistors. Having no depression, no post-etch residue of polysilicon will be produced at the memory cell boundary. It is therefore possible to prevent occurrence of a short between gate electrodes and formation of particles both caused by such a post-etch residue.

The polysilicon may be any gate electrode material, such as a metal, a silicide-based material and a multilayer structure of these materials.

Alteration to Embodiment 1

Figure 6:
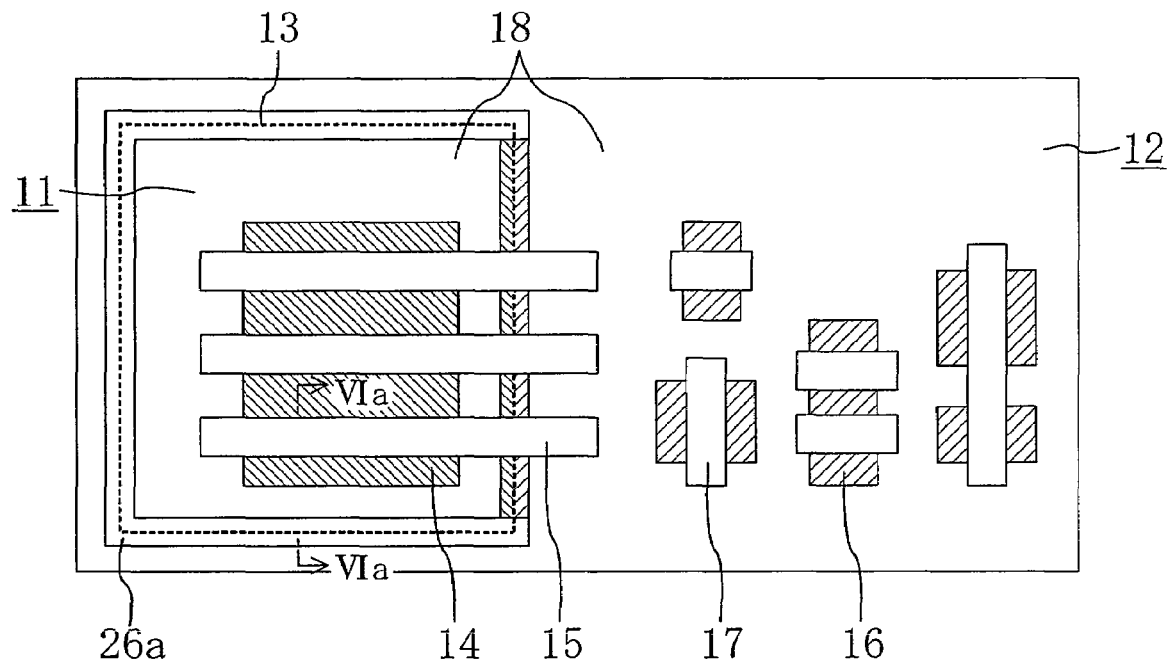
FIG. 6 is a plan view of an alteration to Embodiment 1 of the present invention.

FIG. 6 shows a plan configuration of a nonvolatile semiconductor device of an alteration to Embodiment 1 of the present invention.

As shown in FIG. 6, the nonvolatile semiconductor memory device includes a memory cell area 11 having a MONOS structure and a peripheral circuit area 12. A memory cell boundary 13 defines the boundary between the memory cell area 11 and the peripheral circuit area 12. In the memory cell area 11, formed are MONOS memory cells each made of an active region 14 and a gate electrode 15. In the peripheral circuit area 32, formed are MOS transistors each made of an active region 16 and a gate electrode 17. A portion of the active region 14 above which a gate electrode 15 is formed in the memory cell area 11 and a portion of the active region 16 above which a gate electrode 17 is formed in the peripheral circuit area 12 are respectively surrounded by the STI 18. Although not shown in FIG. 6, an ONO insulating film is formed between the active region 14 and the gate electrodes 15 in the memory cell area 11, while a gate insulating film is formed between the active region 16 and the gate electrodes 17. That is, the boundary between the ONO insulating film and the gate insulating film defines the memory cell boundary 13. The gate electrodes 15 in the memory cell area 11 constitute word lines, which extend into the peripheral circuit area 12. A feature of the alteration to Embodiment 1 is that a portion of the memory cell boundary 13 over which the gate electrodes 15 of MONOS memory cells extend into the peripheral circuit area 12 is located above an active region as in Embodiment 1, but polysilicon 26a, the same material as the gate electrodes, is formed above the remaining portion of the memory cell boundary 13 over which no gate electrode 15 extends into the peripheral circuit area 12.

Figure 7:
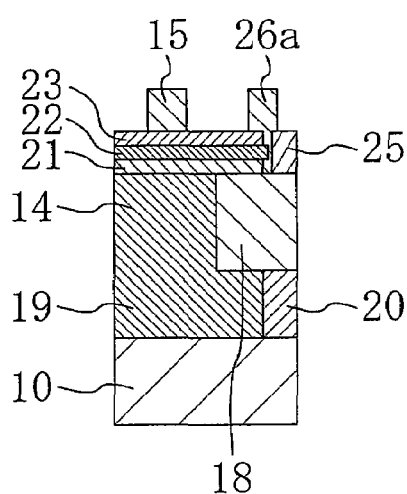
FIG. 7 is a cross-sectional view showing a process flow of the alteration to Embodiment 1 of the present invention.

FIG. 7 shows a cross-sectional configuration taken along line VIa-VIa in FIG. 6.

As shown in FIG. 7, the portion of the memory cell boundary 13 over which no gate electrode 15 extends into the peripheral circuit area 12 is located above the STI 18 in the semiconductor substrate 10. Alternatively, such a portion of the memory cell boundary 13 may be formed above an active region, not above the STI 18. By locating the portion of the memory cell boundary 13 over which no gate electrode 15 extends into the peripheral circuit area 12 above an active region, no depression will be formed at the boundary, as in Embodiment 1. Moreover, since the polysilicon 26a is formed at such a portion of the memory cell boundary 13, no post-etch residue of polysilicon will be left at such a memory cell boundary. Note that the cross-sectional configuration of the portion of the memory cell boundary 13 over which the gate electrodes 15 of MONOS memory cells extend into the peripheral circuit area 12 is the same as that shown in Embodiment 1.

The portion of the memory cell boundary 13 over which the gate electrodes 15 extend is located above the active region, not the STI region. Therefore, no depression will be formed between the ONO insulating film of MONOS memory cells and the gate oxide film 25 of MOS transistors. Moreover, the polysilicon 28a is formed at the remaining portion of the memory cell boundary 13 over which no gate electrode extends into the peripheral circuit area 12. Therefore, since a depression at the memory cell boundary 13, if any, will be buried with the polysilicon, no post-etch residue will be produced. Also, even if the intermediate nitride film overhangs at the memory cell boundary 13, such an overhang will also be buried with the polysilicon, and thus no post-etch residue will be produced, either. In this way, by forming the polysilicon 26a at the memory cell boundary 13, production of a post-etch residue can be prevented, and thus occurrence of a short and formation of particles both caused by such a post-etch residue can be prevented.

The line width of the polysilicon 26a formed at the memory cell boundary 13 may be determined considering the processing limit in a process used, the size margin of the overhanging intermediate nitride film 22, the margin of misalignment and the like.

For example, in the case of 65 nm process, assume that the size margin of the ONO processing mask 24 is 50 nm, the margin of misalignment of the ONO processing mask 24 from the cell well 19 is 30 nm, the size margin of a processing mask for the polysilicon 26a at the memory cell boundary is 10 nm, and the margin of misalignment of the processing mask for the polysilicon 26a from the active region 14 is 15 nm. The root-sum-square of the above four values is calculated to obtain about 60 nm. From this, it is found that the polysilicon 26a having a line width of 120 nm, as a margin of 60 nm on both sides with respect to the memory cell boundary 13, should be formed at the memory cell boundary 13.

Although the memory cell boundary 13 and the boundary between the cell well 19 and the transistor well 20 are shown as being in line with each other in the figures, they may be displaced from each other.

Note that Embodiment 1 and the alteration to Embodiment 1 described above may be applied to only a major portion of a memory array, and may not necessarily be applied to a special pattern causing no yield degradation.

In FIG. 6, there may be no gate electrode 15 extending over the memory cell boundary located above the active region. In other words, a feature of this embodiment is that the memory cell boundary 13 is located above the active region, but if a portion of the memory cell boundary is located above the STI, polysilicon may be placed over the portion of the memory cell boundary.

Embodiment 2

A nonvolatile semiconductor memory device and a fabrication method for the same in Embodiment 2 of the present invention will be described with reference to the relevant drawings.

Embodiment 2 is directed to preventing formation of a depression at the memory cell boundary through some contrivance in the process, to thereby prevent production of a polysilicon residue that is likely to occur when the memory cell boundary is located above STI.

Figure 8:
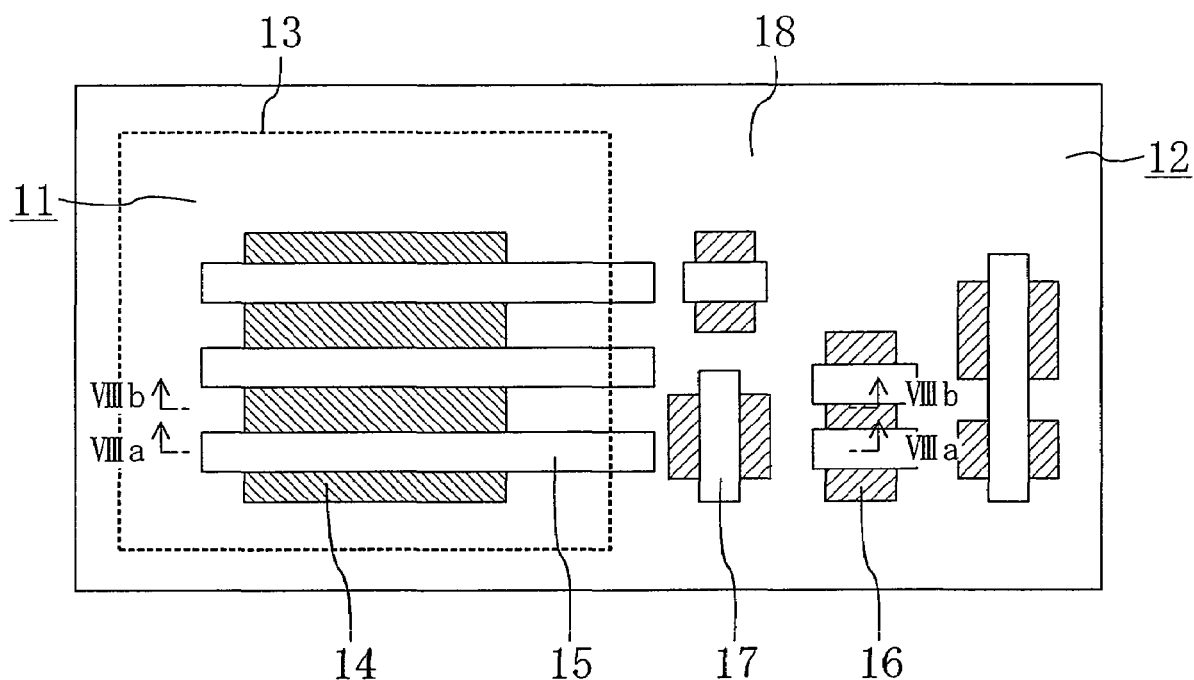
FIG. 8 is a plan view of Embodiments 2 and 3 of the present invention.

FIG. 8 shows a plan configuration of the nonvolatile semiconductor memory device of Embodiment 2. Note that a gate insulating film that should lie under gate electrodes is omitted in FIG. 8. The nonvolatile semiconductor memory device of Embodiment 2 is the same in plan view as the conventional nonvolatile semiconductor memory device.

As shown in FIG. 8, the nonvolatile semiconductor memory device includes a memory cell area 11 having a MONOS structure and a peripheral circuit area 12. A memory cell boundary 13 defines the boundary between the memory cell area 11 and the peripheral circuit area 12. In the memory cell area 11, formed are MONOS memory cells each made of an active region 14 and a gate electrode 15. In the peripheral circuit area 12, formed are MOS transistors each made of an active region 16 and a gate electrode 17. The active regions 14 and 16 are respectively surrounded by STI 18. Although not shown in FIG. 8, an ONO insulating film is formed between the active region 14 and the gate electrodes 15 in the memory cell area 11, while a gate insulating film is formed between the active region 16 and the gate electrodes 17 in the peripheral circuit area 12. That is, the boundary between the ONO insulating film and the gate insulating film defines the memory cell boundary 13. The gate electrodes 15 formed in the memory cell area 11 constitute word lines, which extend into the peripheral circuit area 12. In the nonvolatile semiconductor memory device of Embodiment 2, the memory cell boundary 13 is located above the STI 18.

A process flow of the nonvolatile semiconductor memory device of Embodiment 2 of the present invention will be described with reference to FIGS. 9A to 9C, 10A, 10B, 11A and 11B, which show cross-sectional configurations in the fabrication process steps for the nonvolatile semiconductor memory device of Embodiment 2. Note that while the cross-sectional configurations of FIGS. 9A to 11A are common for both the section taken along line VIIIa-VIIIa and the section taken along line VIIIb-VIIIb in FIG. 8, FIG. 11B shows only the section taken along line VIIIa-VIIIa, that is, a section including a gate electrode 15 of MONOS memory cells.

Figure 9A:
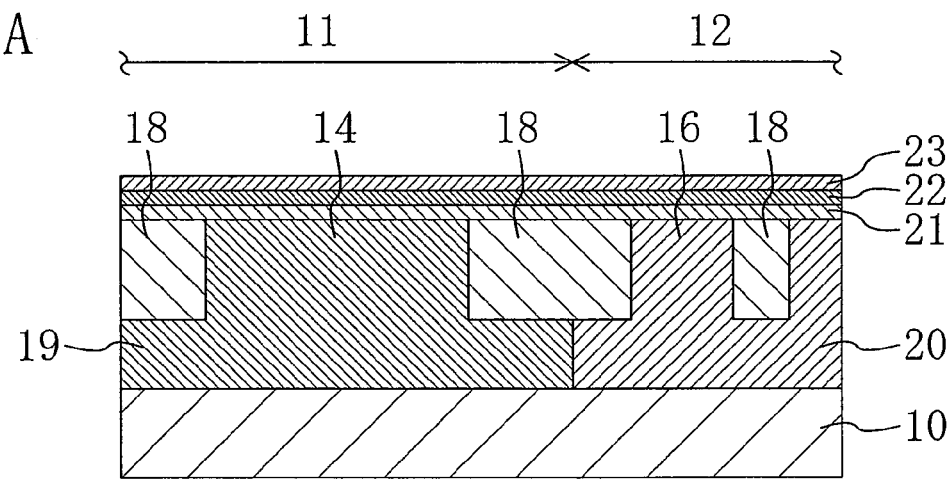
FIGS. 9A to 9C are cross-sectional views showing a process flow of Embodiment 2 of the present invention.

First, as shown in FIG. 9A, a cell well 19 for the memory cell area 11, a transistor well 20 for the peripheral circuit area 12 and the STI 18 that is to be an isolation film are formed on a semiconductor substrate 10. The active regions 14 and 16 are respectively formed in the cell well 19 and the transistor well 20. An ONO insulating film made of a bottom oxide film 21, an intermediate nitride film 22 and a top oxide film 23 is then formed. The portion of the ONO insulating film formed in the memory cell area 11 constitutes a gate insulating film of NOMOS memory cells.

Figure 9B:
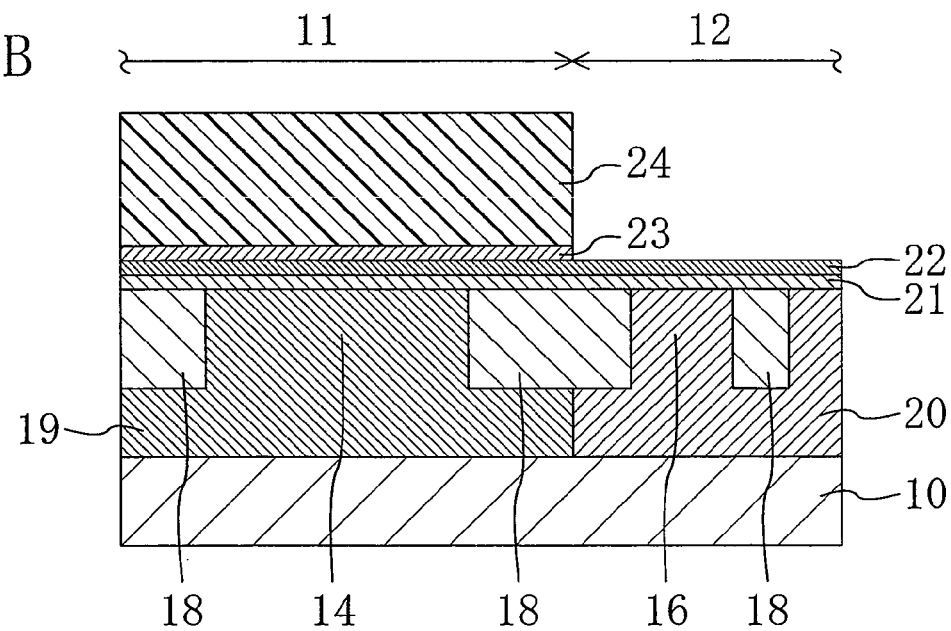

As shown in FIG. 9B, an ONO processing mask 24 is formed in the memory cell area 11, to remove the portion of the top oxide film 23 in the peripheral circuit area 12 by wet etching.

Figure 9C:
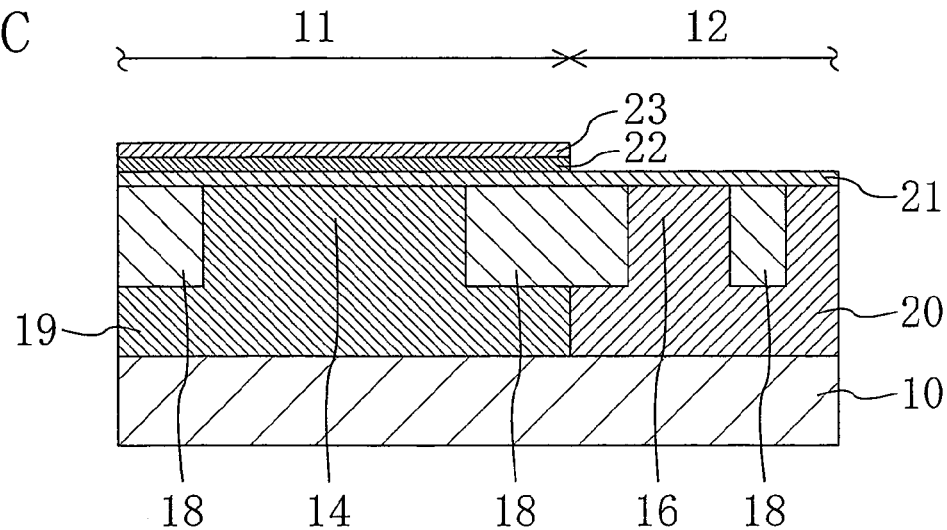

As shown in FIG. 9C, the ONO processing mask 24 is removed, and using the top oxide film 23 in the memory cell area 11 as a mask, the portion of the intermediate nitride film 22 in the peripheral circuit area 12 is removed by wet etching.

The top oxide film 23 may not be formed in the step of forming the ONO insulating film shown in FIG. 9A, but be formed in a later step of forming a gate oxide film of peripheral transistors. Otherwise, the top oxide film 23 may be formed in both the step of forming the ONO insulating film and the step of forming a gate oxide film of peripheral transistors. The portions of the top oxide film 23 and intermediate nitride film 22 formed in the peripheral circuit area 12 may be removed in succession by dry etching using the ONO processing mask 24.

The process steps so far are the same as those in the conventional procedure.

Figure 10A:
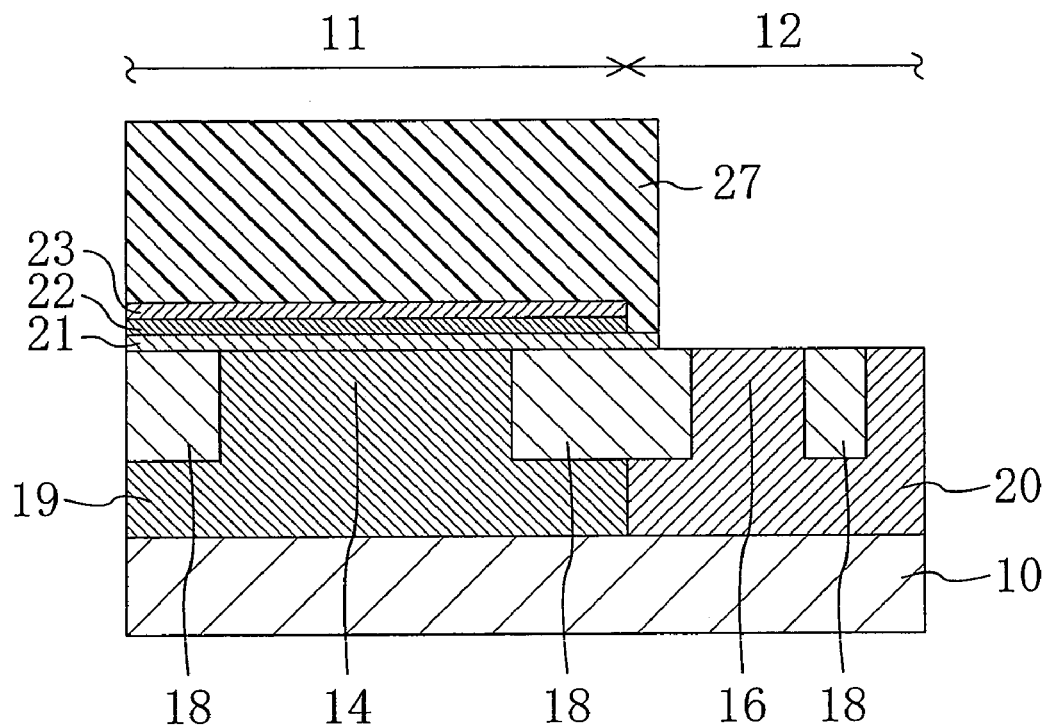
FIGS. 10A and 10B are cross-sectional views showing the process flow of Embodiment 2 of the present invention.

Subsequently, as shown in FIG. 10A, a bottom oxide (BO) processing mask 27 is formed on the memory cell area 11, to remove the bottom oxide film 21 in the peripheral circuit area 12 by wet etching. The BO processing mask 27 is made to cover the end of the intermediate nitride film 22, so that the conventional problems of formation of a depression on the STI 18 at the memory cell boundary and overhanging of the intermediate nitride film of the ONO insulating film can be prevented. No polysilicon residue will therefore be produced at the memory cell boundary.

Figure 10B:
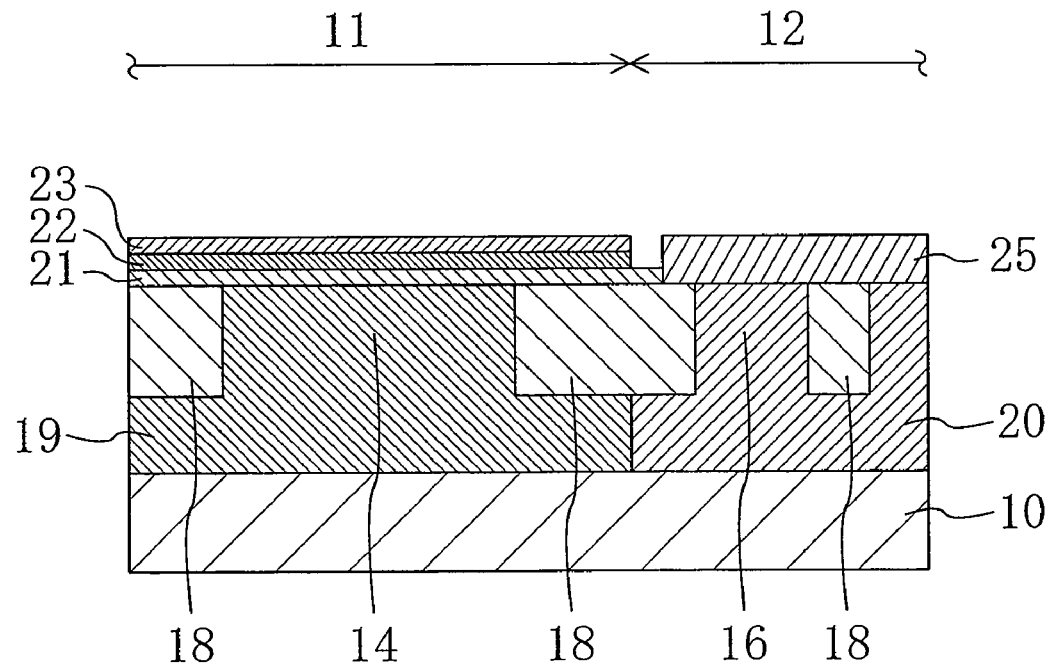

As shown in FIG. 10B, a gate oxide film 25, which is to be a gate insulating film of MOS transistors in the peripheral circuit area 12, is formed by thermal oxidation.

Figure 11A:
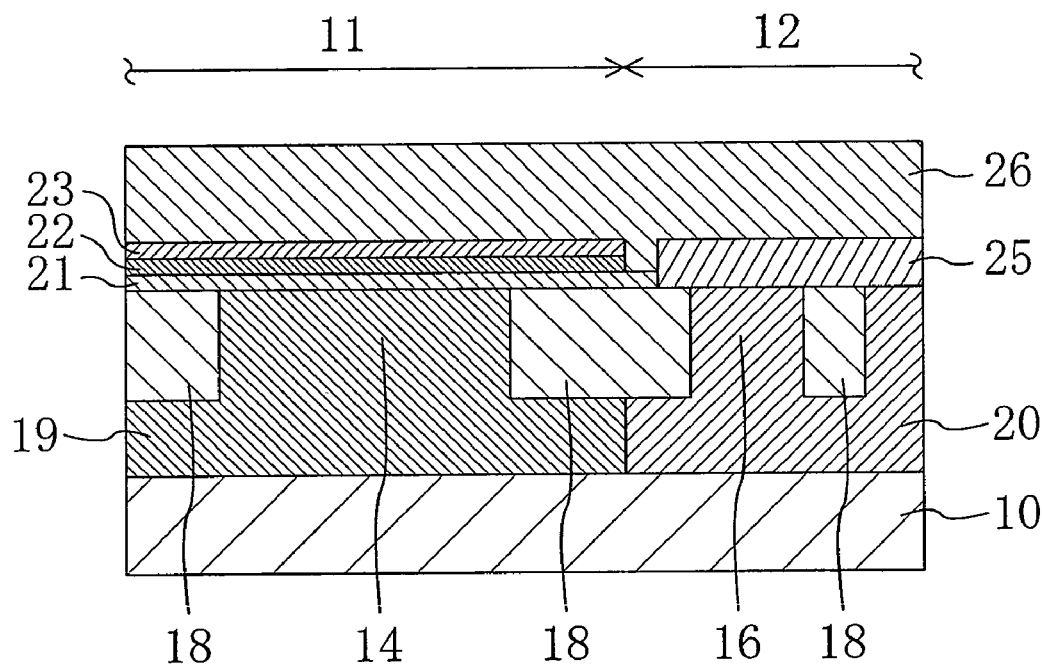
FIGS. 11A and 11B are cross-sectional views showing the process flow of Embodiment 2 of the present invention.
Figure 11B:
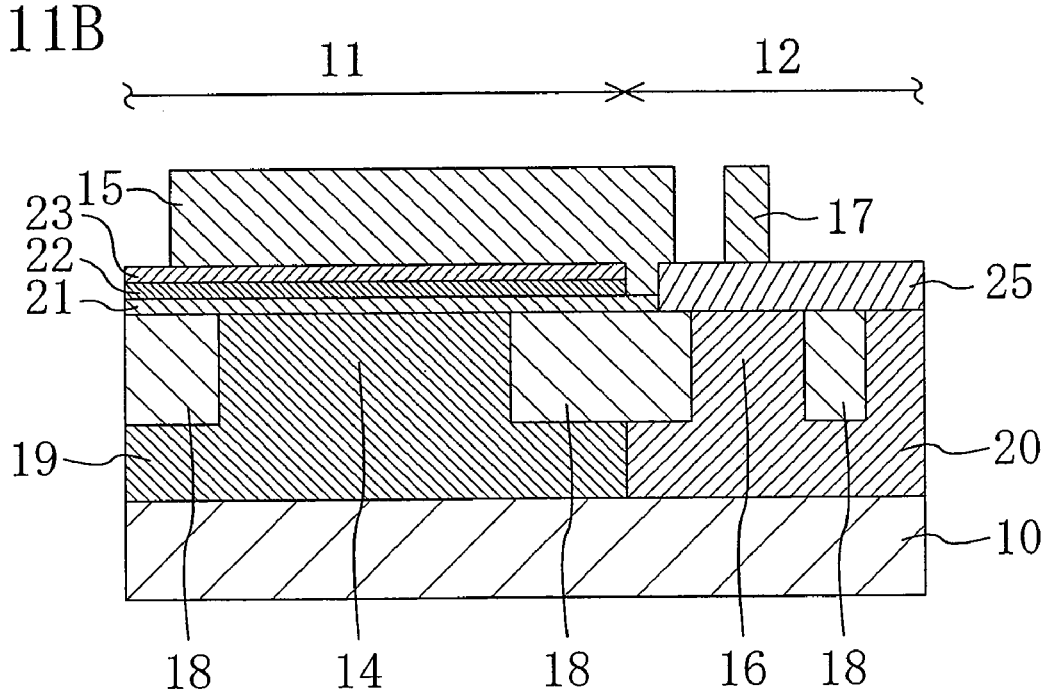

As shown in FIG. 11A, polysilicon 26, which is to be gate electrodes of MONOS memory cells and MOS transistors, is deposited on the top surface of the semiconductor substrate 10.

As shown in FIG. 11B, the polysilicon 26 is etched to form the gate electrode 15 of MONOS memory cells and the gate electrode 17 of MOS transistors.

As described above, in Embodiment 2, in which the BO processing mask 27 covers the end of the intermediate nitride film 22, no depression will be formed on the STI at the memory cell boundary, and also the intermediate nitride film of the ONO insulating film will not overhang. No polysilicon residue will therefore be produced at the memory cell boundary during formation of the gate electrodes.

Embodiment 2 is related to a process in which no depression is formed on the STI even if the memory cell boundary is located above the STI. In the case of locating the memory cell boundary above the active region, not above the STI, also, no depression will be formed at the memory cell boundary, and also the intermediate nitride film of the ONO insulating film will not overhang.

In general, the processing precision of gate electrodes is about one-tenth of the minimum line width thereof used in a chip. Anisotropic etching is preferably used to improve the processing precision of gate electrodes. However, in the conventional case described above in which the end of the intermediate nitride film of the ONO insulating film overhangs from the end of the bottom oxide film and polysilicon is deposited under the overhang of the intermediate nitride film, isotropic etching must be used to remove the polysilicon under the overhang. In view of this, when the portions of the bottom oxide film and STI under the end of the intermediate nitride film are removed by etching forming a void under the end of the intermediate nitride film, that is, when the intermediate nitride film overhangs at the memory cell boundary, the overhang amount should fall within about one-tenth of the minimum line width used in a chip. This is a guideline that permits use of isotropic etching while maintaining the processing precision of gate electrodes.

In the conventional case, it is predicted that in the process step of removing the about 5 nm-thick bottom oxide film, the STI will be etched by a depth of about 10 nm. To form gate electrodes having a minimum line width of about 100 nm or less, therefore, it is is preferred to adopt the process using the BO processing mask.

Although detailed description is omitted, it should be noted that if there are a plurality of steps of removing a silicon oxide film at the memory cell boundary, including the step of removing the bottom oxide film, it is necessary to select the process depending on whether or not the sum of the void under the intermediate nitride film, that is, the overhang amount of the intermediate nitride film, produced because the portions of the bottom oxide film and STI under the end of the intermediate nitride film are etched away in these steps, fall within one-tenth of the minimum line width used in a chip.

Embodiment 3

A nonvolatile semiconductor memory device and a fabrication method for the same in Embodiment 3 of the present invention will be described with reference to the relevant drawings.

Embodiment 3 is directed to a fabrication method in which formation of a depression at the memory cell boundary is prevented through some contrivance in the process, to thereby prevent production of a polysilicon residue that is likely to occur when the memory cell boundary is located above STI. Embodiment 3 is characterized in the top oxide film constituting the ONO insulating film. The plan configuration of the nonvolatile semiconductor memory device of Embodiment 3 is the same as that of Embodiment 2 and thus omitted here.

A process flow of the nonvolatile semiconductor memory device of Embodiment 3 of the present invention will be described with reference to FIGS. 12A to 12C, 13A, 13B, and 14A to 14C, which show cross-sectional configurations in the fabrication process steps for the nonvolatile semiconductor memory device of Embodiment 3. Note that while the cross-sectional configurations of FIGS. 12A to 14B are common for both the section taken along line VIIIa-VIIIa and the section taken along line VIIIb-VIIIb in FIG. 8, FIG. 14C shows only the section taken along line VIIIa-Villa in FIG. 8, that is, a section including a gate electrode 15 of MONOS memory cells.

Figure 12A:
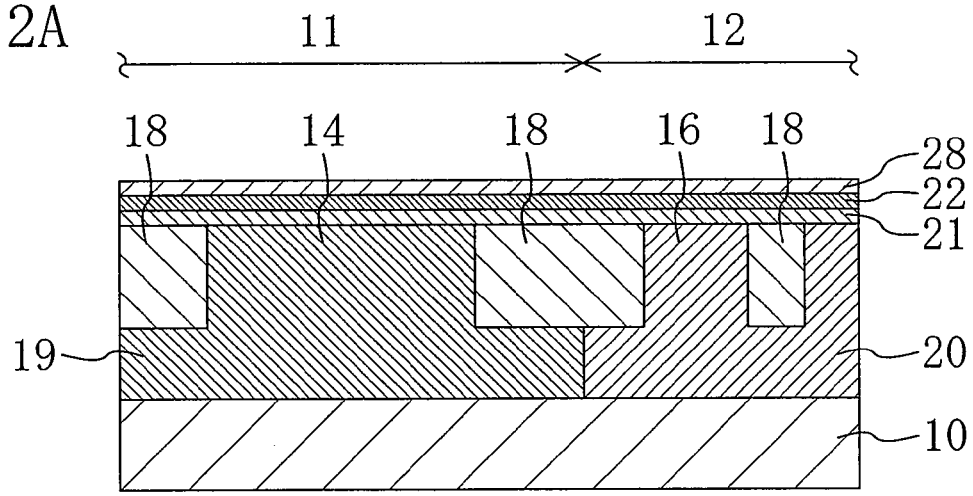
FIGS. 12A to 12C are cross-sectional views showing a process flow of Embodiment 3 of the present invention.

First, as shown in FIG. 12A, a cell well 19 for the memory cell area 11, a transistor well 20 for the peripheral circuit area 12 and the STI 18 that is to be an isolation film are formed on a semiconductor substrate 10. Active regions 14 and 16 are respectively formed in the cell well 19 and the transistor well 20. An ONO insulating film made of a bottom oxide film 21, an intermediate nitride film 22 and a sacrifice oxide film 28 is then formed. Although the sacrifice oxide film 28 is partly removed in a later step, a top oxide film 23 will be formed to give the ONO insulating film in the memory cell area 11 to thereby constitute a gate insulating film of MONOS memory cells.

Figure 12B:
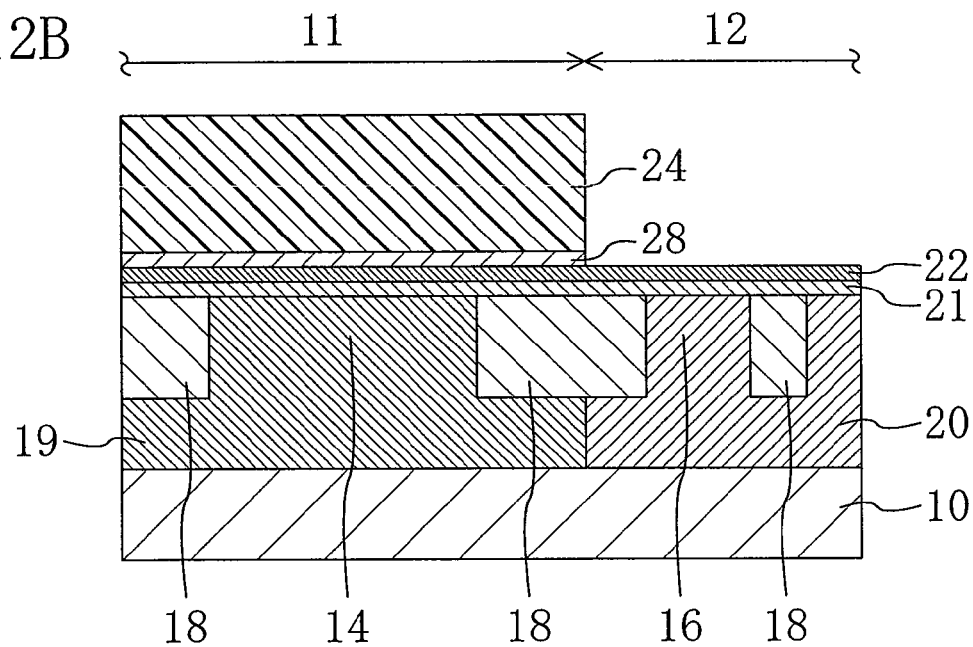

As shown in FIG. 12B, an ONO processing mask 24 is formed on the memory cell area 11, to remove the portion of the sacrifice oxide film 28 in the peripheral circuit area 12 by wet etching.

Figure 12C:
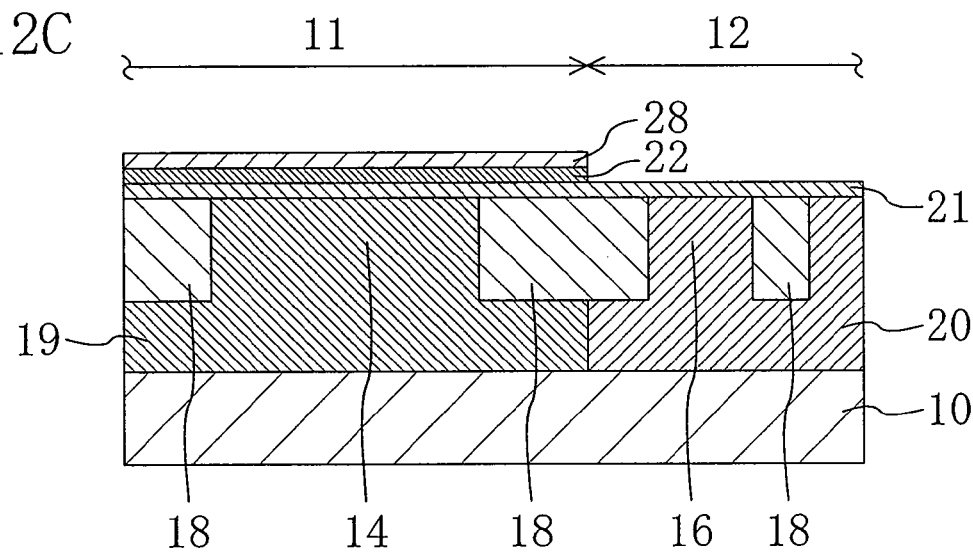

As shown in FIG. 12C, the ONO processing mask 24 is removed, and using the sacrifice oxide film 28 in the memory cell area 11 as a mask, the portion of the intermediate nitride film 22 in the peripheral circuit area 12 is removed by wet etching.

Figure 13A:
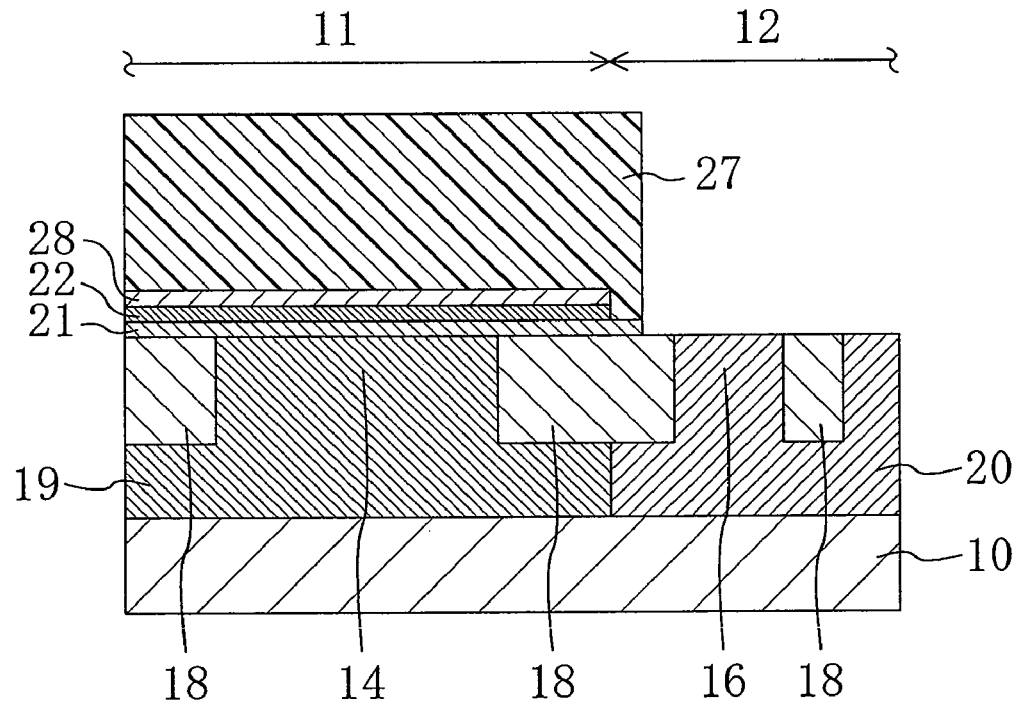
FIGS. 13A and 13B are cross-sectional views showing the process flow of Embodiment 3 of the present invention.

As shown in FIG. 13A, a BO processing mask 27 is formed on the memory cell area 11 to cover the end of the intermediate nitride film 22, to remove the portion of the bottom oxide film 21 formed in the peripheral circuit area 12 by wet etching. Thus, as in Embodiment 2, with the formation of the BO processing mask 27 to cover the end of the intermediate nitride film 22, it is possible to prevent formation of a depression on the STI at the memory cell boundary and overhanging of the intermediate nitride film 22 of the ONO insulating film. No polysilicon residue is therefore produced at the memory cell boundary.

Figure 13B:
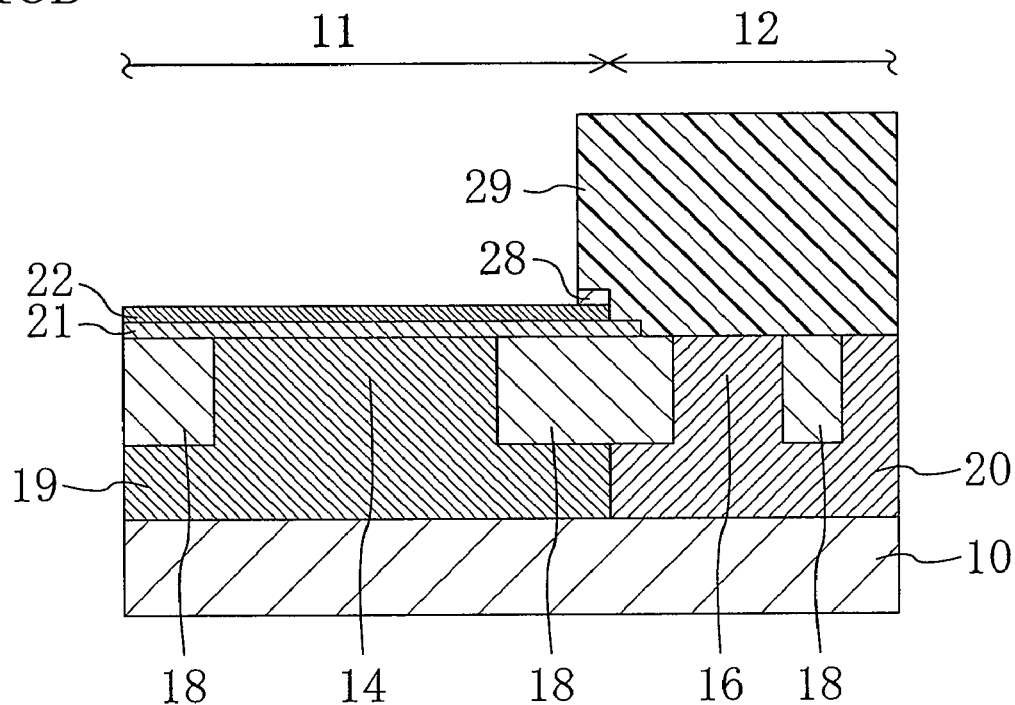

As shown in FIG. 13B, a dummy oxide (DO) processing mask 29 is formed on the peripheral circuit area 12, to remove the portion of the sacrifice oxide film 28 in the memory cell area 11 by wet etching. The DO processing mask 29 is formed over the peripheral circuit area 12 spreading into the memory cell area 11 to cover the end of the intermediate nitride film 22. With such a DO processing mask, formation of a depression on the STI at the memory cell boundary and overhanging of the intermediate nitride film 22 of the ONO insulating film can further be prevented. No polysilicon residue is therefore produced at the memory cell boundary.

Figure 14A:
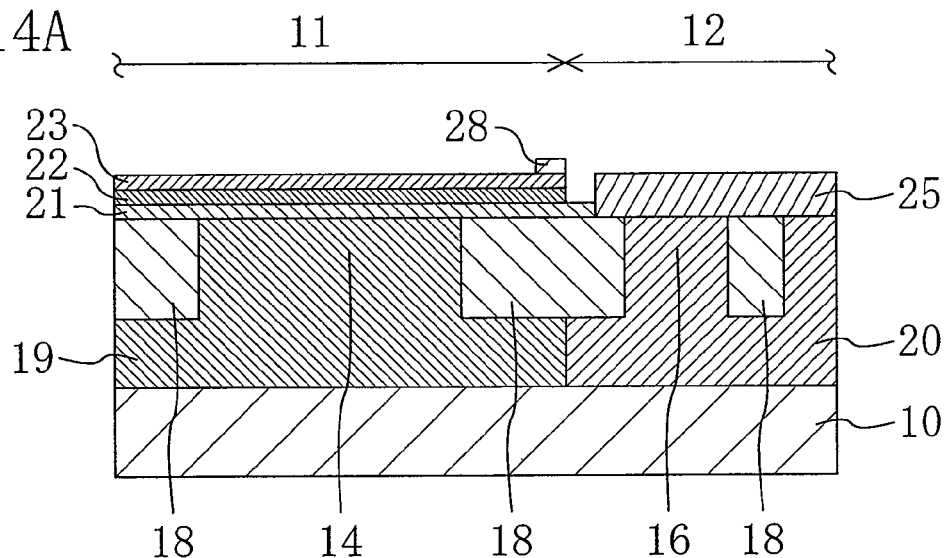
FIGS. 14A to 14C are cross-sectional views showing the process flow of Embodiment 3 of the present invention.

As shown in FIG. 14A, the DO processing mask 29 is removed, and a gate oxide film 25, which is to be a gate insulating film of MOS transistors in the peripheral circuit area 12, is formed by thermal oxidation. In this step, the upper portion of the intermediate nitride film 22 is oxidized forming the top oxide film 23 constituting the ONO insulating film. Note that the top oxide film 23 may be formed in a plurality of oxidizing steps or a step of forming an oxide film by chemical vapor deposition (CVD) in some cases.

Figure 14B:
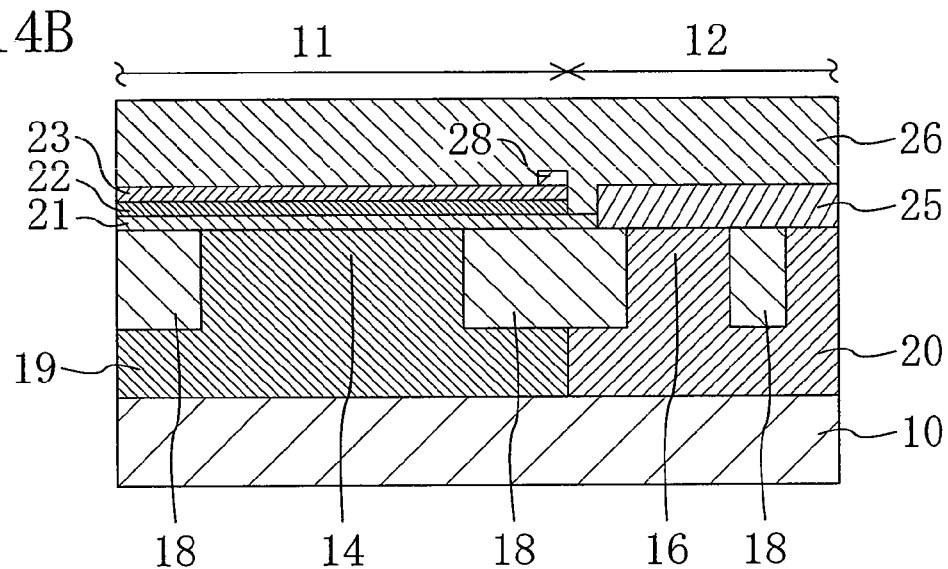
Figure 14C:
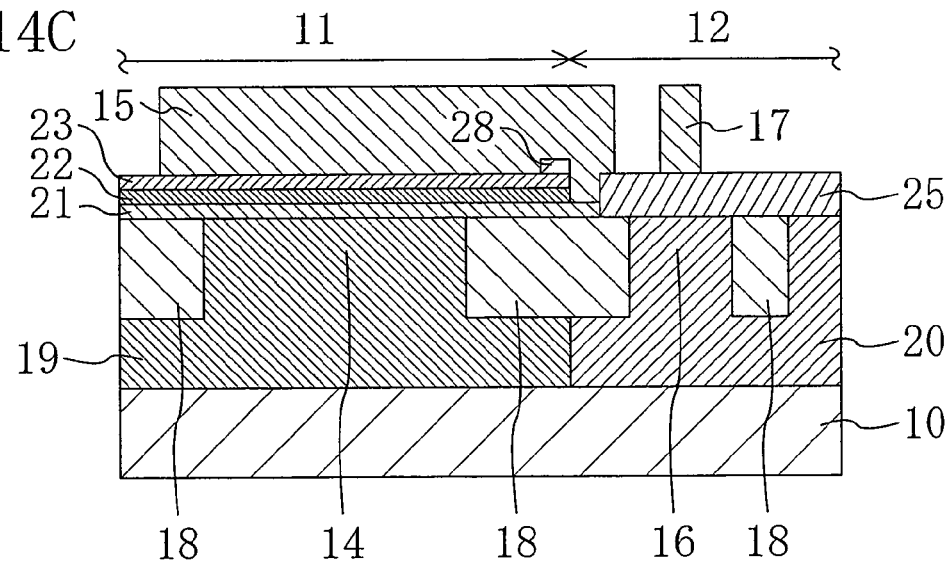
Figure 15:
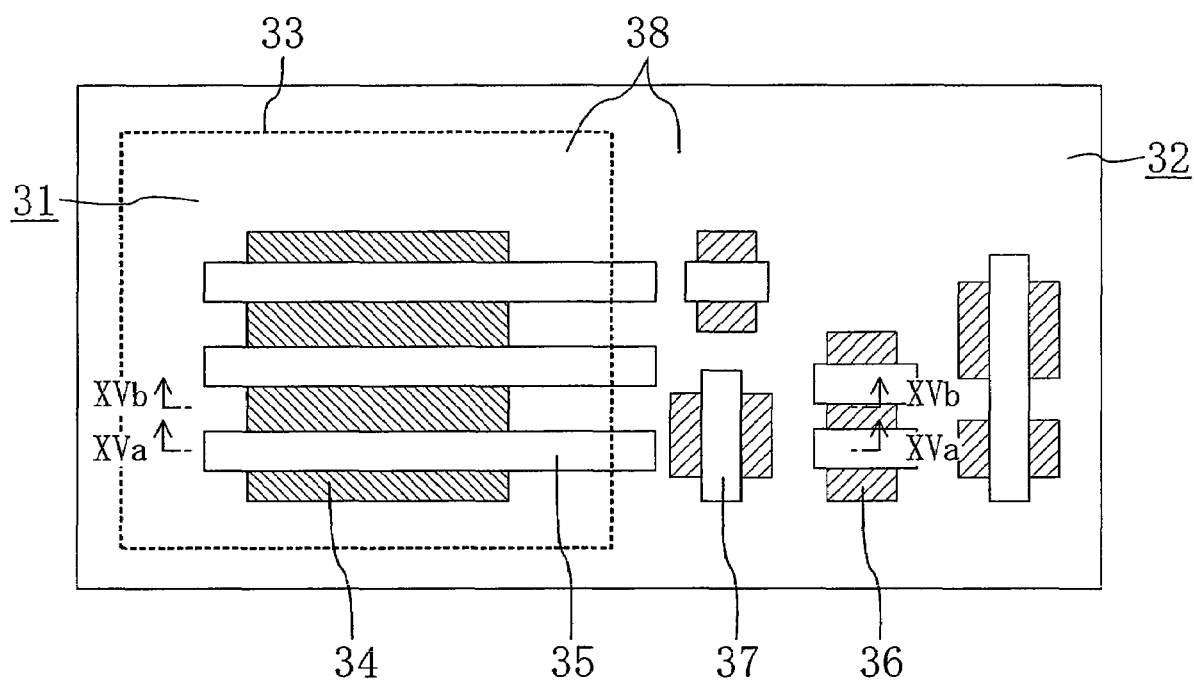
FIG. 15 is a plan view of a conventional semiconductor memory device.
Figure 16A:
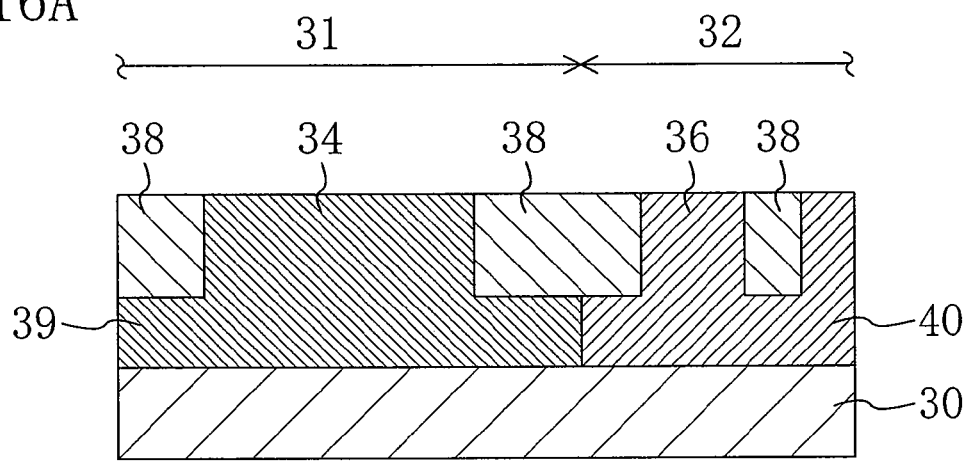
FIGS. 16A to 16C are cross-sectional views showing a process flow of the conventional device.
Figure 16B:
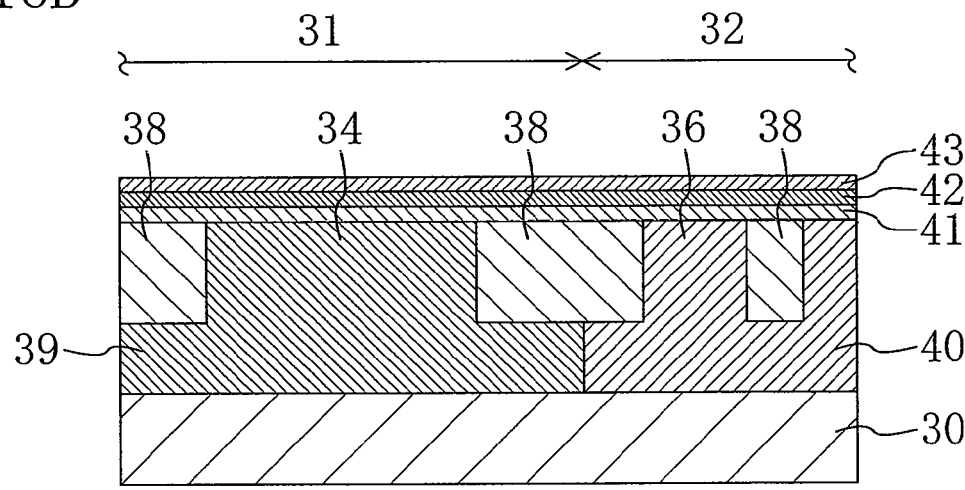
Figure 16C:
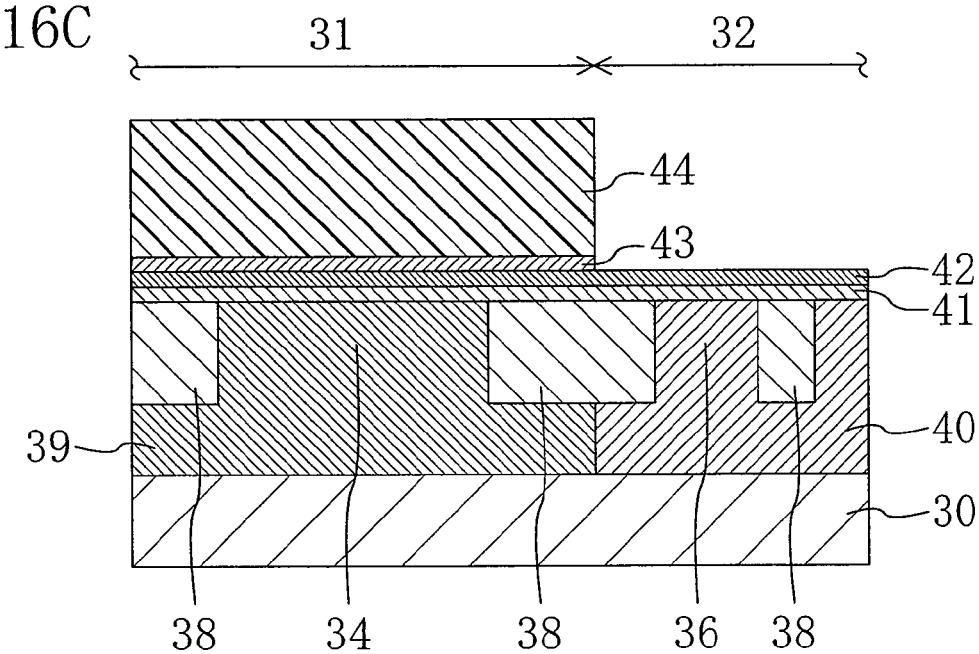
Figure 17A:
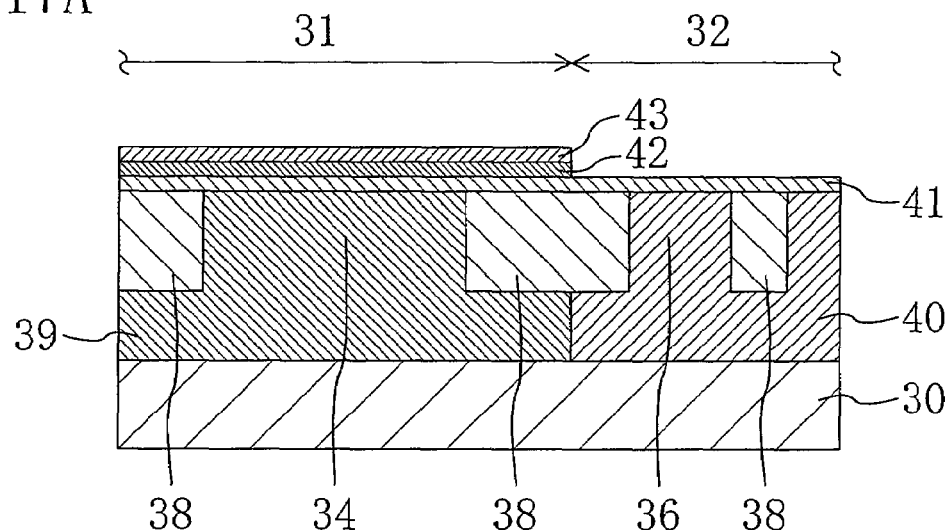
FIGS. 17A to 17C are cross-sectional views showing the process flow of the conventional device.
Figure 17B:
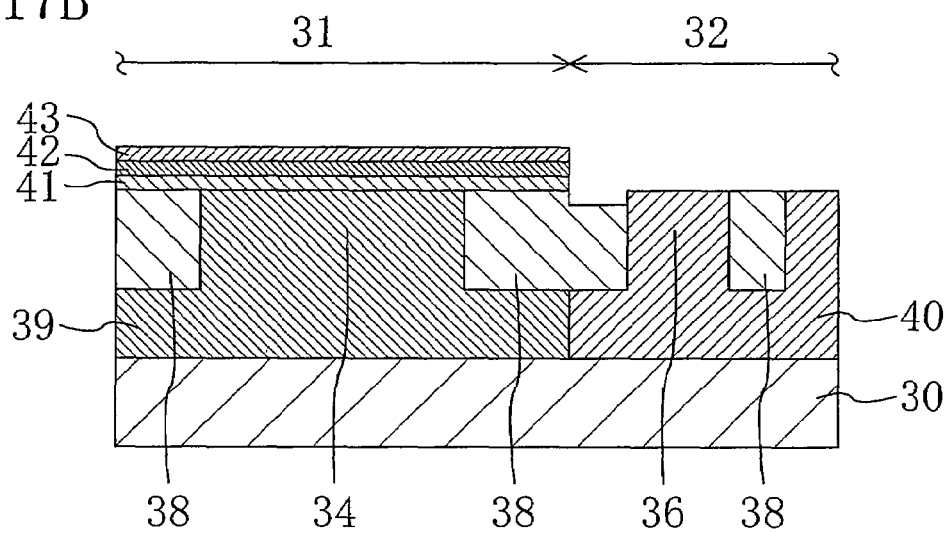
Figure 17C:
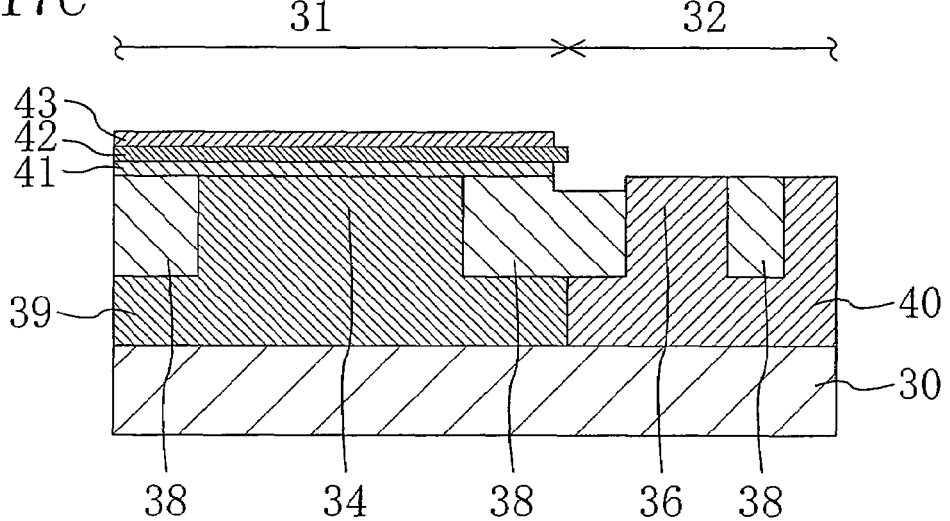
Figure 18A:
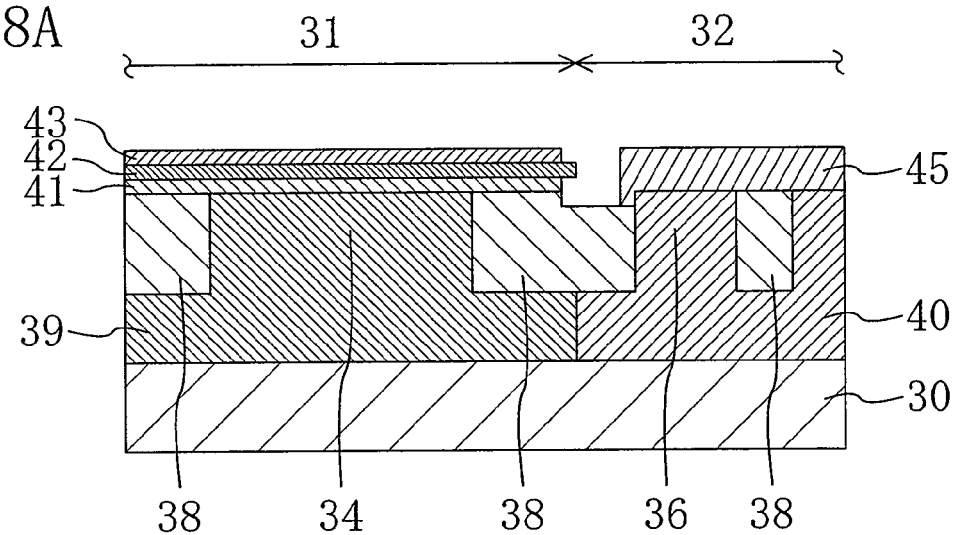
FIGS. 18A to 18C are cross-sectional views showing the process flow of the conventional device.
Figure 18B:
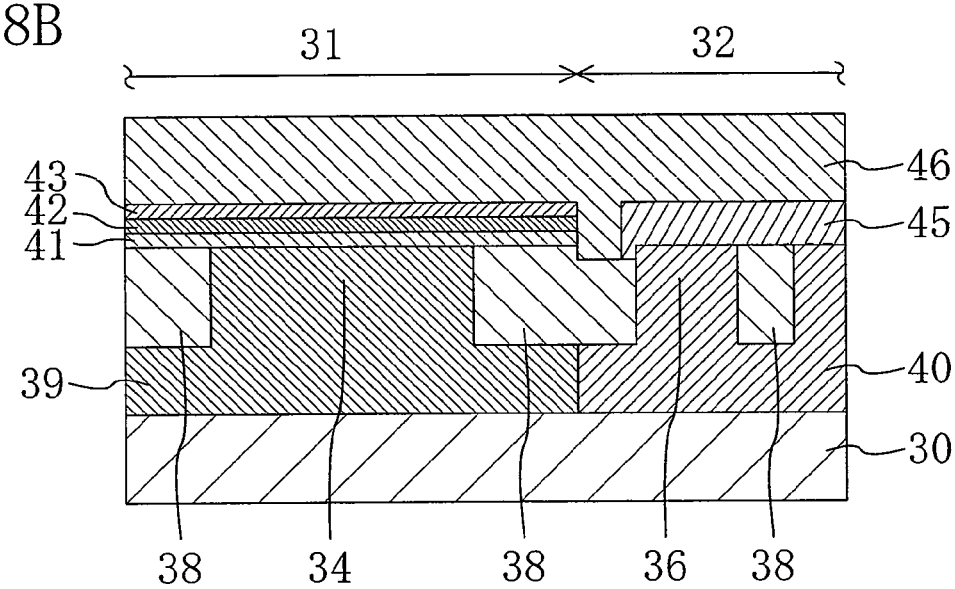
Figure 18C:
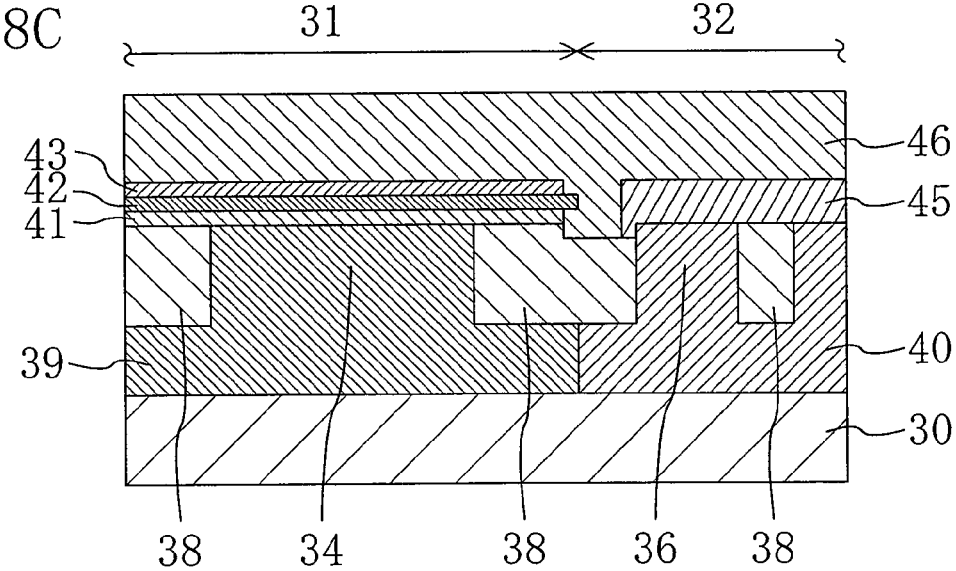
Figure 19A:
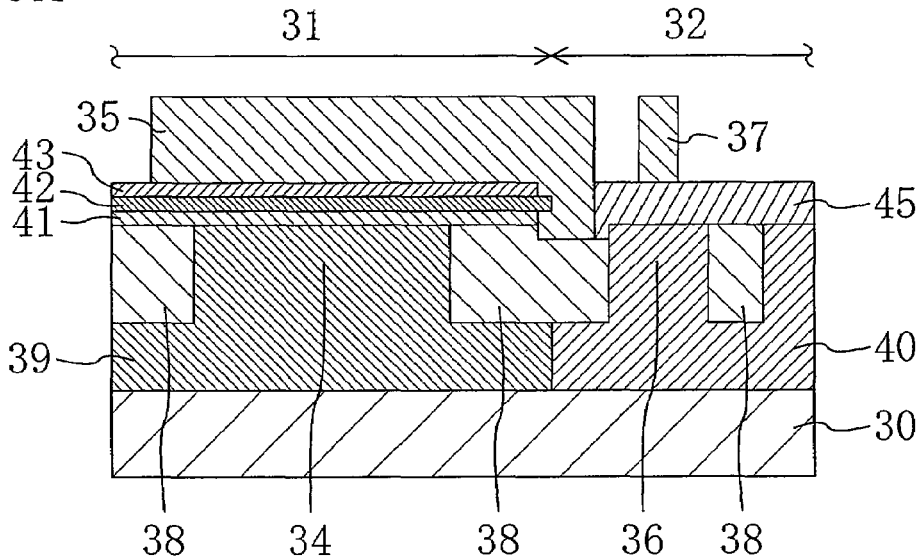
FIGS. 19A to 19C are cross-sectional views showing the process flow of the conventional device.
Figure 19B:
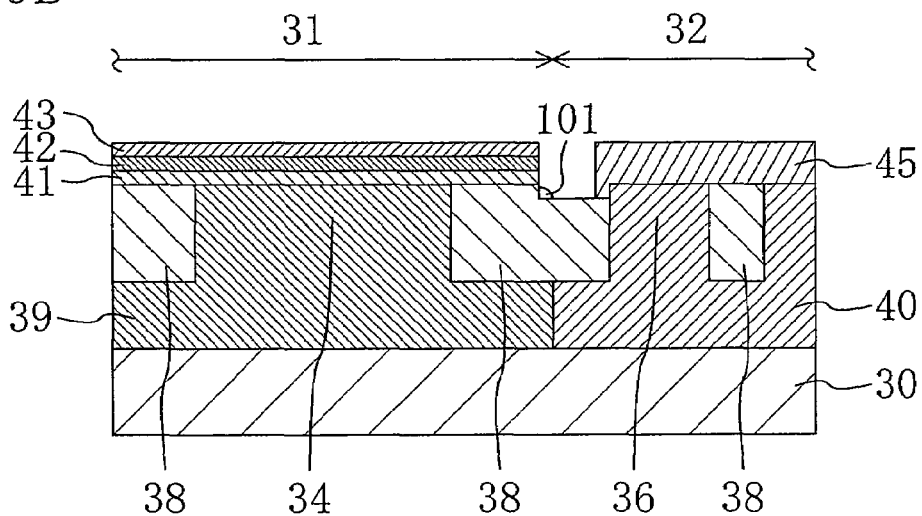
Figure 19C:
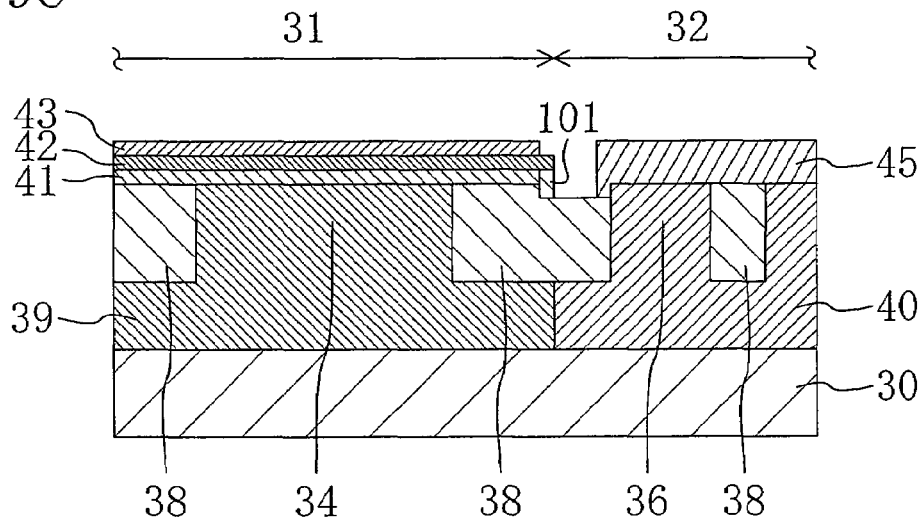

As shown in FIG. 14B, polysilicon 26, which is to be gate electrodes of MONOS memory cells and MOS transistors, is deposited on the top surface of the semiconductor substrate 10.

As shown in FIG. 14C, the polysilicon 26 is etched to form the gate electrode 15 of the MONOS memory cells and the gate electrode 17 of the MOS transistors.

As described above, in Embodiment 3, in which the DO processing mask 29 and the BO processing mask 27 are formed to cover the end of the intermediate nitride film 22, no depression will be formed on the STI at the memory cell boundary, and also the intermediate nitride film of the ONO insulating film will not overhang. No polysilicon residue will therefore be produced at the memory cell boundary during formation of the gate electrodes.

As described above, the nonvolatile semiconductor memory device and the fabrication method for the same of the present invention, which can prevent production of a polysilicon residue at the memory cell boundary, are useful as a MONOS memory and a fabrication method for the same.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A fabrication method for a nonvolatile semiconductor memory device comprising a memory cell area including memory cells and a peripheral circuit area adjacent to the memory cell area and including peripheral transistors, the method comprising the steps of:
   (1) forming a first active region in the memory cell area and a second active region in the peripheral circuit area in a substrate by forming isolation insulating films in the memory cell area and the peripheral circuit area so as to be away from a boundary between the memory cell area and the peripheral circuit area;
   (2) forming a bottom insulating film and an intermediate charge trap film sequentially over the entire surface of the substrate;
   (3) removing a portion of the intermediate charge trap film formed in the peripheral circuit area using a first mask film;
   (4) forming a gate insulating film in the peripheral circuit area and also at least part of a top insulating film in the memory cell area;
   (5) forming a gate electrode film on the top insulating film and the gate insulating film; and
   (6) forming gate electrodes of memory cells and gate electrodes of peripheral transistors by patterning the gate electrode film,
   wherein the step (3) comprises a step of aligning an end of the first mask film with the boundary in the substrate.

2. The fabrication method of claim 1, wherein in the step (4), the gate insulating film is made to be connected with the bottom insulating film, the intermediate charge trap film and the top insulating film at the boundary.

3. The fabrication method of claim 1, wherein in the step (6), the gate electrode film is left unremoved over a boundary between the memory cell area and an area other than the peripheral circuit area.

4. The fabrication method of claim 1, further comprising, between the steps (3) and (4), the step (7) of removing a portion of the bottom insulating film in the peripheral circuit area.

5. The fabrication method of claim 1, wherein the step (2) comprises a step of forming a lower layer of the top insulating film on the intermediate charge trap film.

6. The fabrication method of claim 5, wherein the step (3) comprises a step of removing a portion of the lower layer of the top insulating film formed in the peripheral circuit area using the first mask film, then removing the first mask film, and removing a portion of the intermediate charge trap film formed in the peripheral circuit area using the lower layer of the top insulating film in the memory cell area as a mask film.

7. The fabrication method of claim 5, wherein in the step (3), a portion of the lower layer of the top insulating film and a portion of the intermediate charge trap film formed in the peripheral circuit area are removed in succession by dry etching using the first mask film.

8. A fabrication method for a nonvolatile semiconductor memory device comprising a memory cell area including memory cells and a peripheral circuit area adjacent to the memory cell area and including peripheral transistors, the method comprising the steps of:
   (1) forming a first active region in the memory cell area and a second active region in the peripheral circuit area in a substrate by forming isolation insulating films in the memory cell area and the peripheral circuit area;
   (2) forming a bottom insulating film and an intermediate charge trap film sequentially over the entire surface of the substrate;
   (3) removing a portion of the intermediate charge trap film formed in the peripheral circuit area using a first mask film;
   (4) removing a portion of the bottom insulating film formed in the peripheral circuit area using a second mask film;
   (5) forming a gate insulating film in the peripheral circuit area and also at least part of a top insulating film in the memory cell area;

(6) forming a gate electrode film on the top insulating film and the gate insulating film; and (7) forming gate electrodes of memory cells and gate electrodes of peripheral transistors by patterning the gate electrode film, wherein in the step (4), the second mask film is formed to be wider toward the peripheral circuit area than the first mask film at the boundary between the memory cell area and the peripheral circuit area, to cover an end of the intermediate charge trap film.

9. The fabrication method of claim 8, wherein the step (2) comprises a step of forming a lower layer of the top insulating film on the intermediate charge trap film.

10. The fabrication method of claim 9, wherein the step (3) comprises a step of removing a portion of the lower layer of the top insulating film formed in the peripheral circuit area using the first mask film, then removing the first mask film, and removing a portion of the intermediate charge trap film formed in the peripheral circuit area using the lower layer of the top insulating film in the memory cell area as a mask film.

11. The fabrication method of claim 9, wherein in the step (3), a portion of the lower layer of the top insulating film and a portion of the intermediate charge trap film formed in the peripheral circuit area are removed in succession by dry etching using the first mask film.

12. A fabrication method for a nonvolatile semiconductor memory device comprising a memory cell area including memory cells and a peripheral circuit area adjacent to the memory cell area and including peripheral transistors, the method comprising the steps of:

(1) forming a bottom insulating film, an intermediate charge trap film and a sacrifice insulating film sequentially over the entire surface of the substrate;

(2) removing a portion of the sacrifice insulating film and a portion of the intermediate charge trap film formed in the peripheral circuit area using a first mask film;

(3) removing a portion of the sacrifice insulating film formed in the memory cell area using a second mask film;

(4) forming a gate insulating film in the peripheral circuit area and also a top insulating film in the memory cell area;

(5) forming a gate electrode film on the top insulating film and the gate insulating film; and (6) forming gate electrodes of memory cells and gate electrodes of peripheral transistors by patterning the gate electrode film, wherein in the step (3), the second mask film is formed to cover an end of the intermediate charge trap film at a boundary between the memory cell area and the peripheral circuit area.

13. The fabrication method of claim 12, further comprising, between the steps (2) and (3), the step of (7) removing a portion of the bottom insulating film formed in the peripheral circuit area using a third mask film formed to be wider toward the peripheral circuit area than the first mask film at the boundary to cover the end of the intermediate charge trap film.

* * * * *